(12) United States Patent
Yamaoka

(10) Patent No.: US 10,790,025 B2
(45) Date of Patent: Sep. 29, 2020

(54) SEMICONDUCTOR MEMORY INCLUDING PLURAL MEMORY BLOCKS, A SEQUENCER THAT CONTROLS A DRIVER, A ROW DECODER, AND SENSE AMPLIFIER MODULES BASED ON COMMANDS HELD IN A COMMAND REGISTER TO PERFORM READ, WRITE, ERASE

(71) Applicant: Toshiba Memory Corporation, Minato-ku (JP)

(72) Inventor: Masashi Yamaoka, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/291,163

(22) Filed: Mar. 4, 2019

(65) Prior Publication Data
US 2019/0371407 A1 Dec. 5, 2019

(30) Foreign Application Priority Data
Jun. 1, 2018 (JP) .................................. 2018-106376

(51) Int. Cl.
| | | |
|---|---|---|
| G11C 16/08 | (2006.01) |
| H01L 27/11524 | (2017.01) |
| G11C 16/26 | (2006.01) |
| H01L 27/11526 | (2017.01) |
| H01L 27/11573 | (2017.01) |
| H01L 27/11582 | (2017.01) |
| G11C 16/04 | (2006.01) |

(Continued)

(52) U.S. Cl.
CPC .......... *G11C 16/08* (2013.01); *G11C 16/0483* (2013.01); *G11C 16/26* (2013.01); *H01L 27/1157* (2013.01); *H01L 27/11524* (2013.01); *H01L 27/11526* (2013.01); *H01L 27/11556* (2013.01); *H01L 27/11573* (2013.01); *H01L 27/11582* (2013.01)

(58) Field of Classification Search
CPC ..... G11C 16/08; G11C 16/0483; G11C 16/16; H01L 27/11524; H01L 27/111526; H01L 27/11556; H01L 27/1157
USPC .......................... 365/185.23, 185.18, 185.2
See application file for complete search history.

(56) References Cited

U.S. PATENT DOCUMENTS

| | | | | |
|---|---|---|---|---|
| 2006/0186942 A1* | 8/2006 | Futatsuyama | .... | H03K 19/01855 327/333 |
| 2008/0068892 A1* | 3/2008 | Hosono | .............. | G11C 16/3427 365/185.18 |
| 2009/0267128 A1 | 10/2009 | Maejima | | |

(Continued)

*Primary Examiner* — Connie C Yoha
(74) *Attorney, Agent, or Firm* — Oblon, McClelland, Maier & Neustadt, L.L.P.

(57) ABSTRACT

According to one embodiment, a semiconductor memory includes: a memory cell array provided in a first layer above a semiconductor substrate and including a plurality of memory cells; a first word line coupled to a first memory cell of the plurality of memory cells; a driver generating a voltage applied to the first word line; a first transistor including one end coupled to the first word line and the other end coupled to the driver; a first transfer gate line coupled to a gate of the first transistor and including a portion passing through the first layer, a second layer between the semiconductor substrate and the first layer, and a third layer above the first layer; and a first level shifter applying a voltage to the first transfer gate line.

16 Claims, 19 Drawing Sheets

(51) Int. Cl.
*H01L 27/1157* (2017.01)
*H01L 27/11556* (2017.01)

(56) References Cited

U.S. PATENT DOCUMENTS

| | | |
|---|---|---|
| 2009/0268522 A1 | 10/2009 | Maejima |
| 2010/0207195 A1 | 8/2010 | Fukuzumi et al. |
| 2011/0284946 A1 | 11/2011 | Kiyotoshi |
| 2016/0071909 A1 | 3/2016 | Lee |
| 2016/0163374 A1 | 6/2016 | Koyama et al. |
| 2017/0104002 A1 | 4/2017 | Hishida et al. |
| 2017/0345508 A1* | 11/2017 | Bushnaq ................ G11C 16/26 |
| 2018/0254087 A1* | 9/2018 | Yamaoka ............... G11C 16/16 |

* cited by examiner

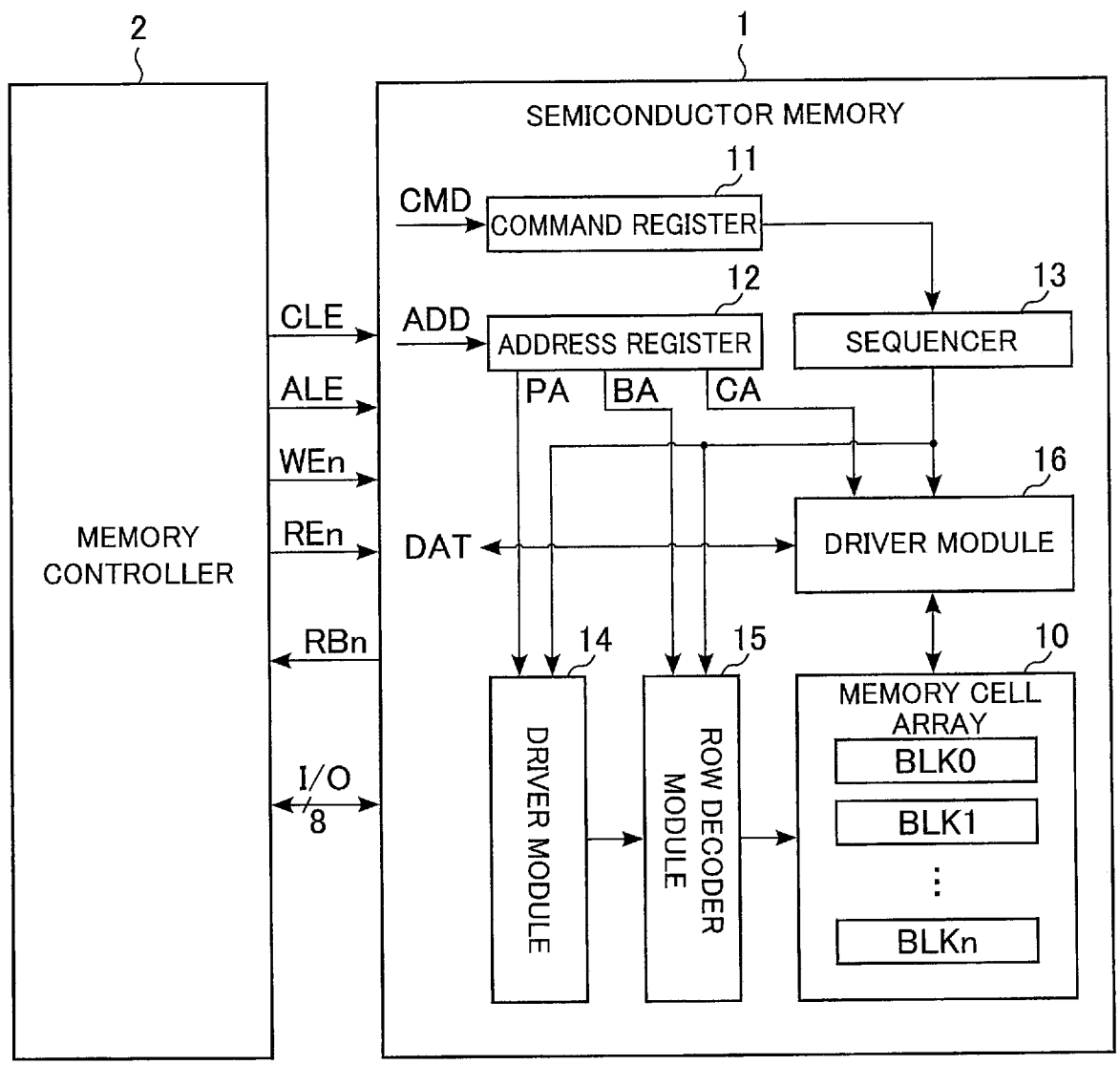
F I G. 1

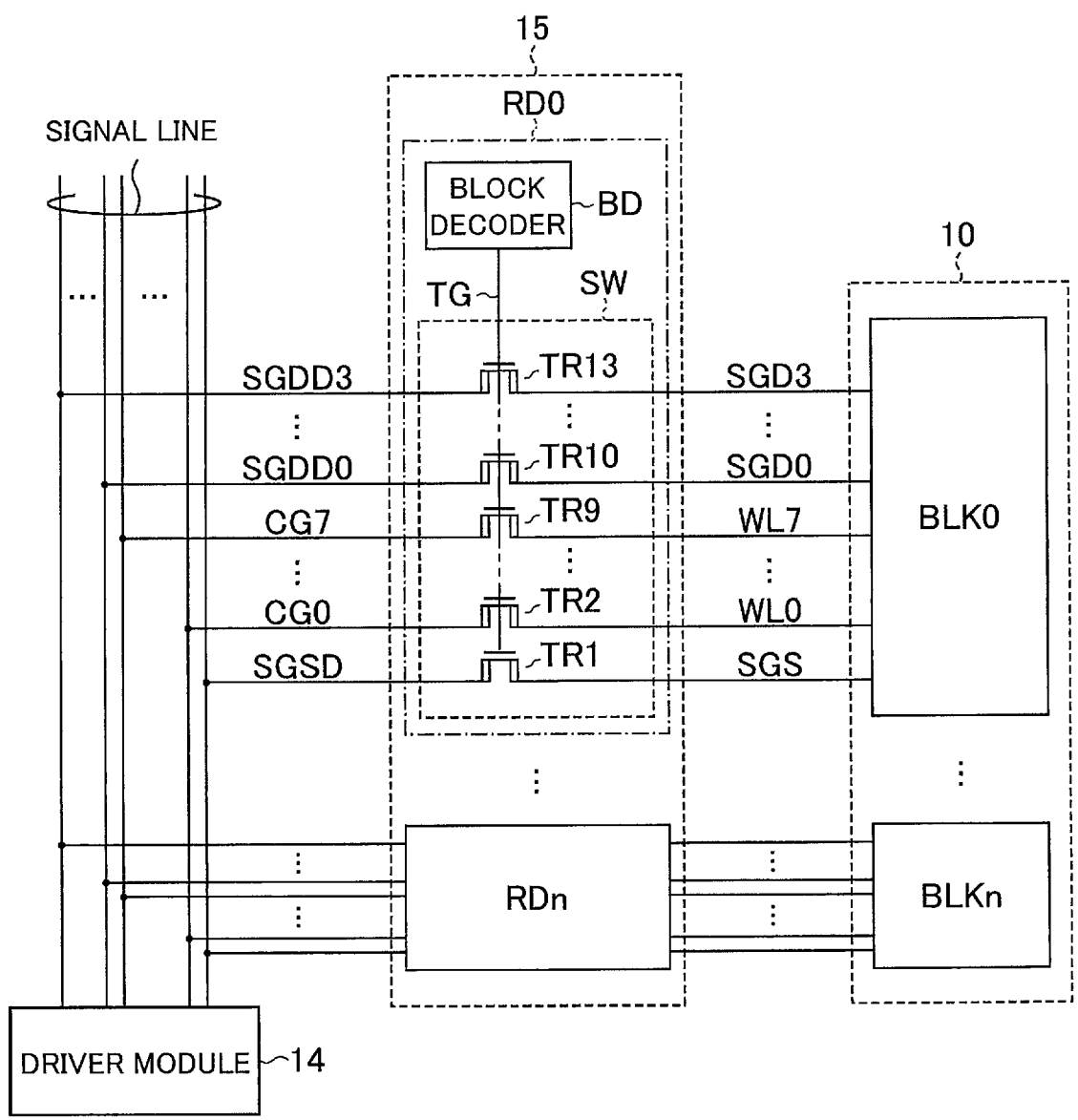
F I G. 3

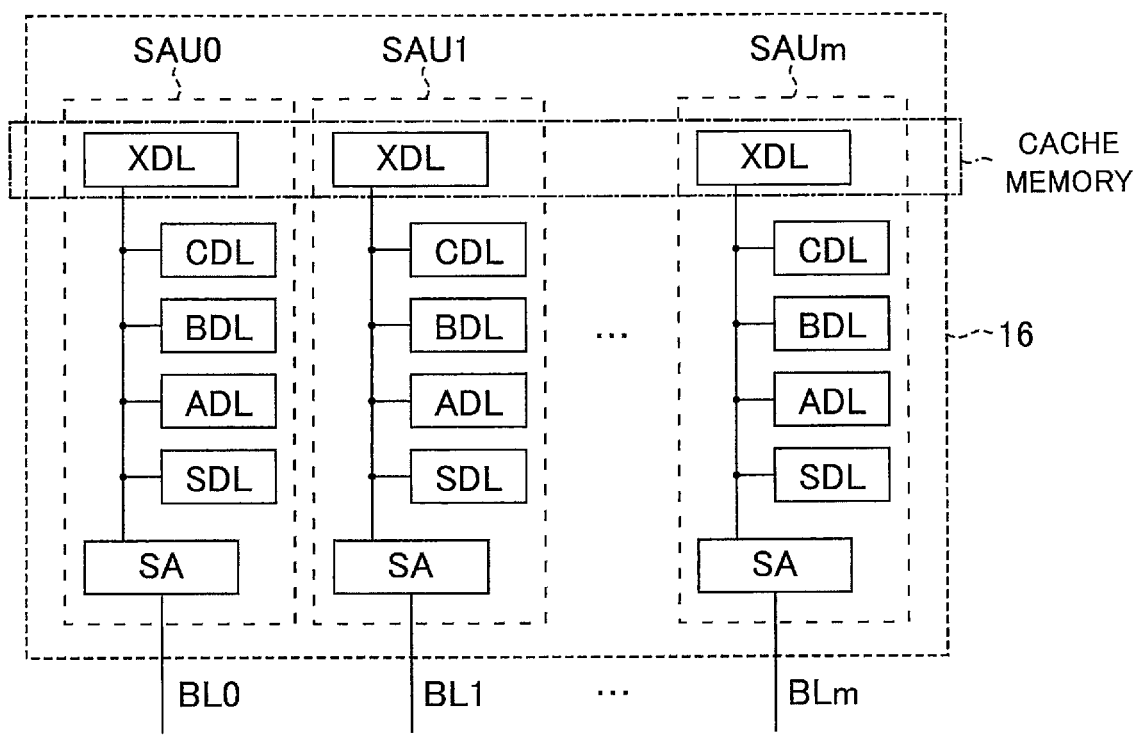
F I G. 5

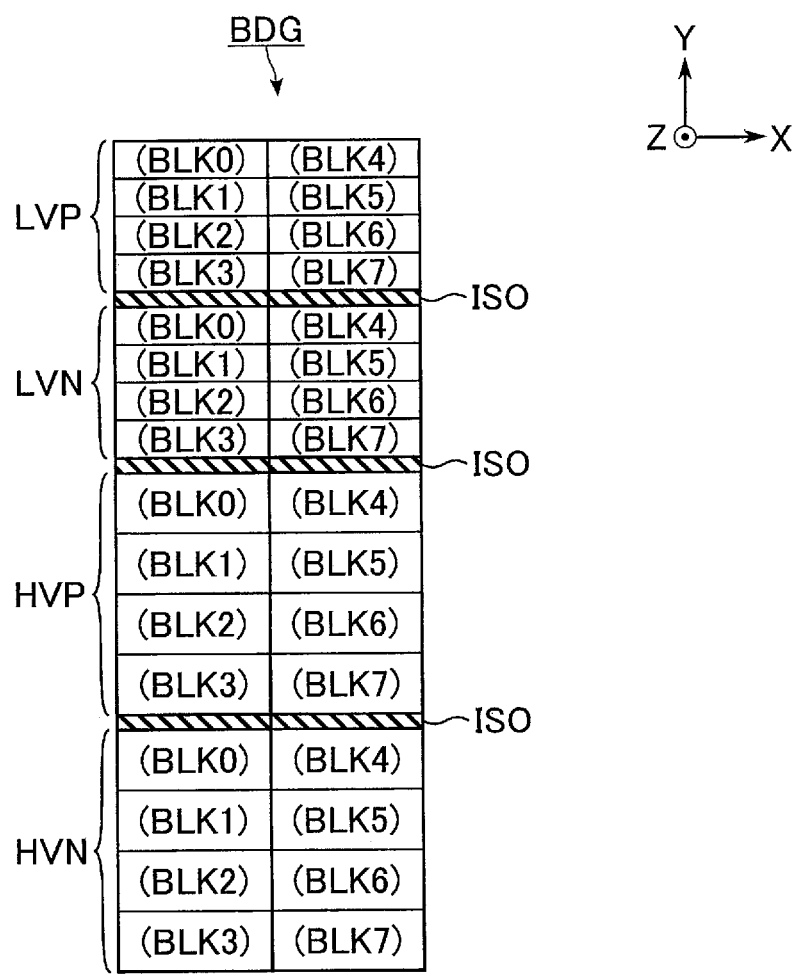
F I G. 9

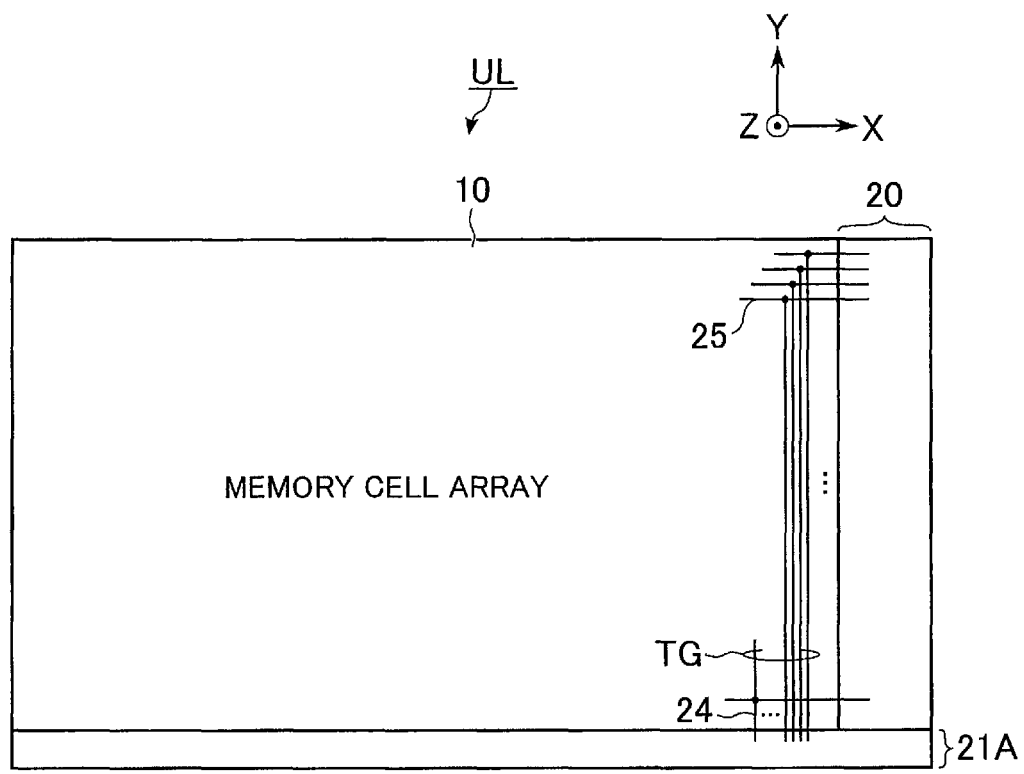
F I G. 10

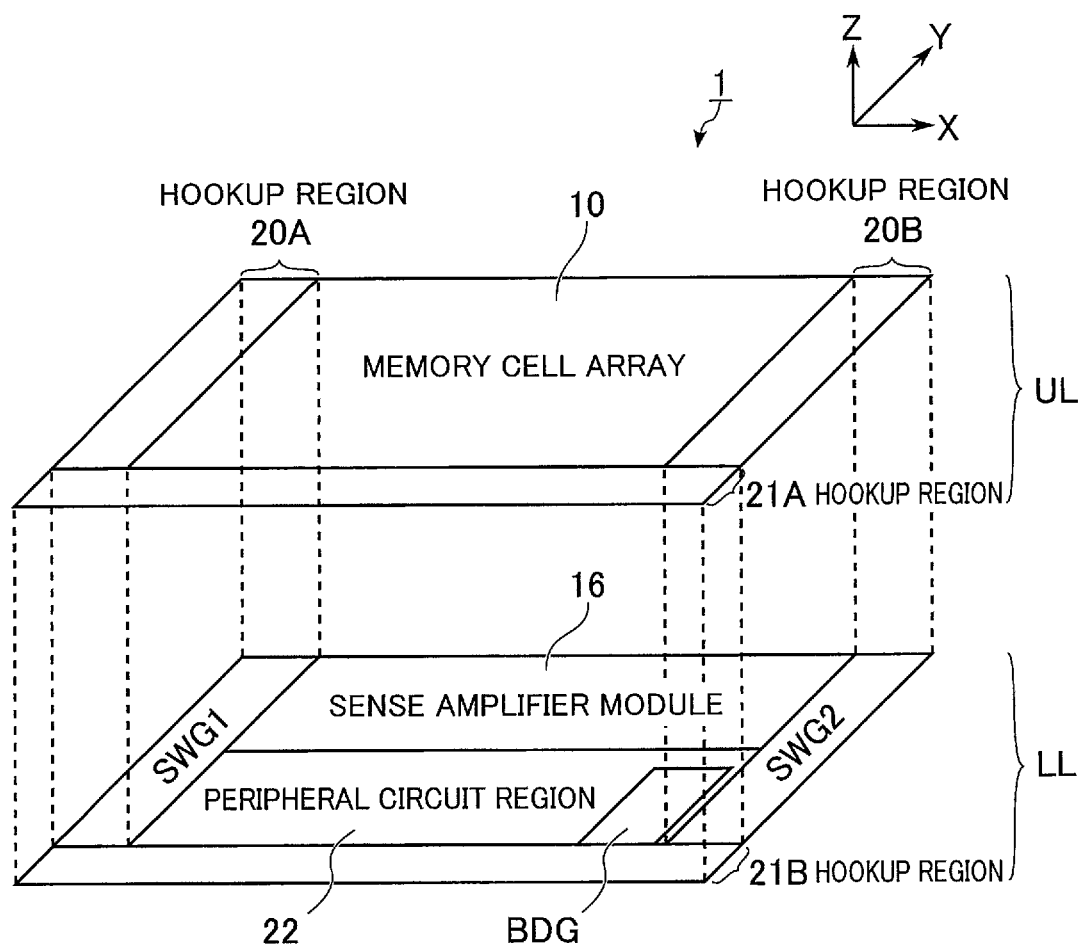
F I G. 19

US 10,790,025 B2

SEMICONDUCTOR MEMORY INCLUDING PLURAL MEMORY BLOCKS, A SEQUENCER THAT CONTROLS A DRIVER, A ROW DECODER, AND SENSE AMPLIFIER MODULES BASED ON COMMANDS HELD IN A COMMAND REGISTER TO PERFORM READ, WRITE, ERASE

CROSS-REFERENCE TO RELATED APPLICATIONS

This application is based upon and claims the benefit of priority from Japanese Patent Application No. 2018-106376, filed Jun. 1, 2018, the entire contents of which are incorporated herein by reference.

FIELD

Embodiments described herein relate generally to a semiconductor memory.

BACKGROUND

A NAND flash memory capable of non-volatilely storing data is known.

BRIEF DESCRIPTION OF THE DRAWINGS

FIG. 1 is a block diagram illustrating a configuration example of a semiconductor memory according to a first embodiment;

FIG. 3 is a circuit diagram illustrating an example of a circuit configuration of a row decoder module in the semiconductor memory according to the first embodiment;

FIG. 5 is a circuit diagram illustrating an example of a circuit configuration of a sense amplifier module in the semiconductor memory according to the first embodiment;

FIG. 9 is a plan view illustrating an example of a planer layout of a block decoder group included in the row decoder module in the semiconductor memory according to the first embodiment;

FIG. 10 is a plan view illustrating an example of a planer layout in the upper part of the semiconductor memory according to the first embodiment;

FIG. 19 is a plan view illustrating an example of a planer layout of each of an upper part and a lower part in a semiconductor memory according to a modification of the first embodiment.

DETAILED DESCRIPTION

Figure 2:
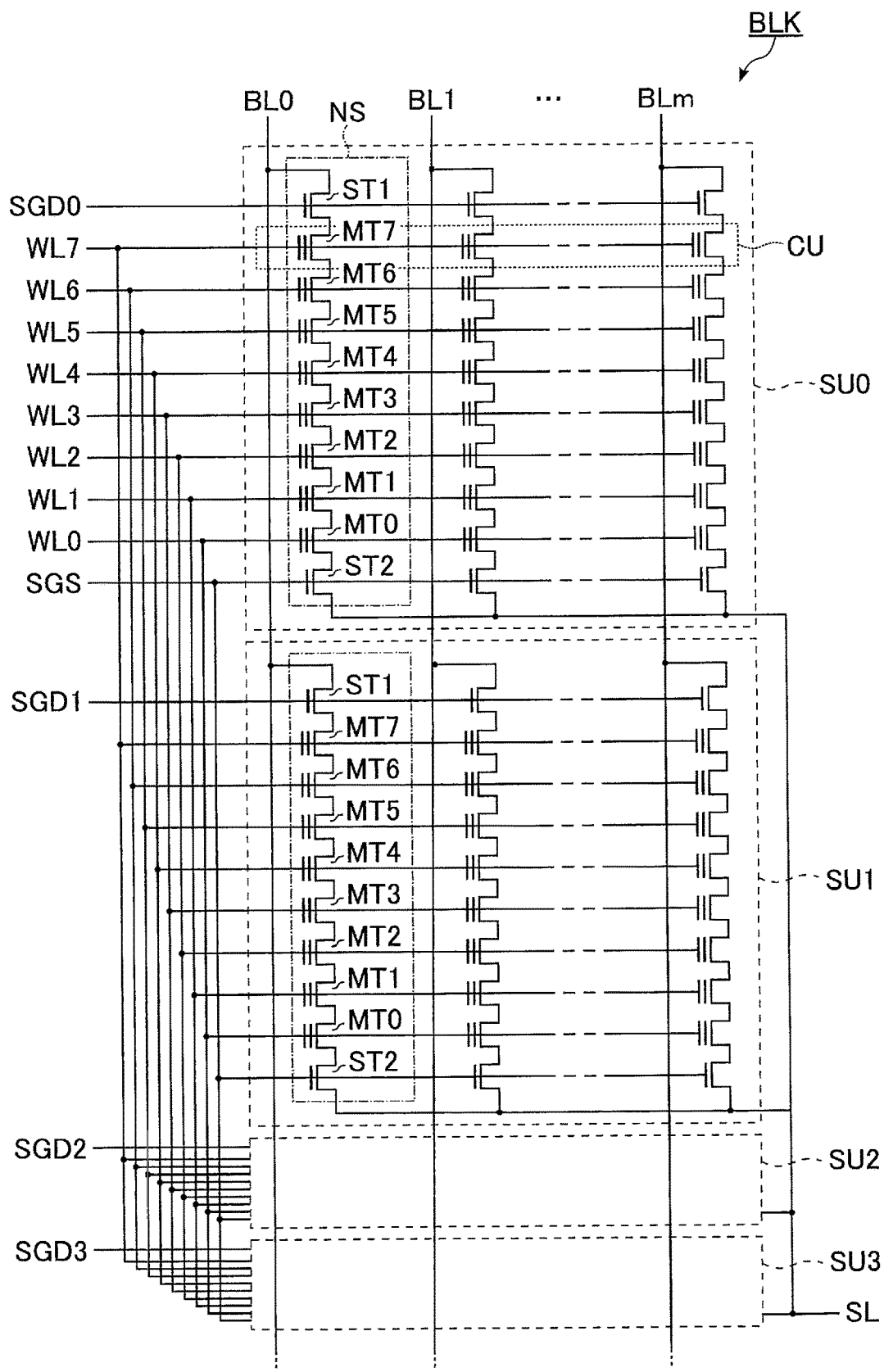
FIG. 2 is a circuit diagram illustrating an example of a circuit configuration of a memory cell array in the semiconductor memory according to the first embodiment.

According to one embodiment, a semiconductor memory includes a memory cell array, a first word line, a driver, a first transistor, a first transfer gate line, and a first level shifter. The memory cell array is provided in a first layer above a semiconductor substrate and includes a plurality of memory cells. The first word line is coupled to a first memory cell of the plurality of memory cells. The driver generates a voltage applied to the first word line. The first transistor includes one end coupled to the first word line and the other end coupled to the driver. The first transfer gate line is coupled to a gate of the first transistor and includes a portion passing through the first layer, a second layer between the semiconductor substrate and the first layer, and a third layer above the first layer. The first level shifter applies a voltage to the first transfer gate line.

Hereinafter, embodiments will be described with reference to the drawings. Each embodiment exemplifies a device and a method for embodying the technical idea of the invention. The drawings are schematic and conceptual, and the dimensions and ratios, etc., in the drawings are not always the same as the actual ones. The technical idea of the present invention is not restricted by the shapes, structures, arrangements, etc., of the structural elements.

In the following descriptions, elements having substantially the same function and configuration will be assigned with the same reference symbol. Numerals suffixed to the reference numerals or characters are used to distinguish the elements having similar configurations. If there is no need to distinguish such elements, they are referred to by the reference symbol with the character only.

[1] First Embodiment

Hereinafter, a semiconductor memory 1 according to the first embodiment will be described.

[1-1] Configuration of Semiconductor Memory 1

[1-1-1] Overall Configuration of Semiconductor Memory 1

The semiconductor memory 1 is, for example, a NAND flash memory capable of non-volatilely storing data. The semiconductor memory 1 is controlled by, for example, an external memory controller 2. FIG. 1 illustrates a configuration example of the semiconductor memory 1 according to the first embodiment.

As illustrated in FIG. 1, the semiconductor memory 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or larger). The memory cell array 10 is provided with a plurality of bit lines and a plurality of word lines. The block BLK is an assembly of nonvolatile memory cells, and is used as, for example, an erase unit of data. Each memory cell is associated with one bit line and one word line. The detailed configuration of the memory cell array 10 will be described later.

The command register 11 holds command CMD received by the semiconductor memory 1 from the memory controller 2. The command CMD includes, for example, commands for causing the sequencer 13 to execute a read operation, a write operation, an erase operation, etc.

The address register 12 holds address information ADD received by the semiconductor memory 1 from the memory controller 2. The address information ADD includes, for example, block address BA, page address PA, and column address CA. For example, the block address BA, the page address PA, and the column address CA are used to select a block BLK, a word line, and a bit line, respectively.

The sequencer 13 controls the operation of the whole semiconductor memory 1. For example, the sequencer 13 controls the driver module 14, the row decoder module 15, and the sense amplifier module 16 based on the command CMD held in the command register 11, and executes a read operation, a write operation, an erase operation, etc.

The driver module 14 generates voltages used for a read operation, a write operation, an erase operation, etc.

The driver module 14 applies the generated voltages, for example, to a signal line corresponding to a selected word line and a signal line corresponding to a non-selected word line, based on the page address PA held in the address register 12.

The row decoder module 15 selects one block BLK based on the block address BA held in the address register 12. The row decoder module 15 transfers, for example, the voltages applied to the signal line corresponding to the selected word line and the signal line corresponding to the non-selected word line, to the selected word line and the non-selected word line in the selected block BLK.

The sense amplifier module 16 applies a desired voltage to each bit line in accordance with write data DAT received from the memory controller 2 in a write operation. The sense amplifier module 16 determines data stored in the memory cells based on the voltage of the bit line, and transfers the determination result to the memory controller 2 as read data DAT in a read operation.

The communication between the semiconductor memory 1 and the memory controller 2 supports, for example, the NAND interface standard. For example, the communication between the semiconductor memory 1 and the memory controller 2 uses a command latch enable signal CLE, an address latch enable signal ALE, a write enable signal WEn, a read enable signal REn, a ready busy signal RBn, and an input/output signal I/O.

The command latch enable signal CLE is a signal for indicating that the input/output signal I/O received by the semiconductor memory 1 is a command CMD. The address latch enable signal ALE is a signal for indicating that the signal I/O received by the semiconductor memory 1 is address information ADD. The write enable signal WEn is a signal for instructing the semiconductor memory 1 to input the input/output signal I/O. The read enable signal REn is a signal for instructing the semiconductor memory 1 to output the input/output signal I/O.

The ready busy signal RBn is a signal for notifying the memory controller 2 whether the semiconductor memory 1 is in a ready state and accepts commands from the memory controller 2, or a busy state and does not accept commands from the memory controller 2. The input/output signal I/O is, for example, an 8-bit width signal, and may include the command CMD, the address information ADD, the data DAT, etc.

The above-described semiconductor memory 1 and memory controller 2 may form one semiconductor device in combination. Examples of the semiconductor device include a memory card such as an SD™ card and a solid state drive (SSD).

[1-1-2] Circuit Configuration of Semiconductor Memory 1

Hereinafter, a description will be given of an example of the circuit configuration of the semiconductor memory 1 according to the first embodiment.

(Circuit Configuration of Memory Cell Array 10)

FIG. 2 illustrates an example of the circuit configuration of the memory cell array 10 in the semiconductor memory 1 according to the first embodiment, by extracting one block BLK out of the plurality of blocks BLK included in the memory cell array 10.

As illustrated in FIG. 2, the block BLK includes, for example, four string units SU0 to SU3. Each string unit SU includes a plurality of NAND strings NS associated respectively with bit lines BL0 to BLm (m is an integer of 1 or larger).

Each NAND string NS includes, for example, eight memory cell transistors MT0 to MT7, and select transistors ST1 and ST2.

Each memory cell transistor MT includes a control gate and a charge accumulation layer, and holds data in a nonvolatile manner. Each of the select transistors ST1 and ST2 is used to select the string unit SU in various operations.

In each NAND string NS, memory cell transistors MT0 to MT7 are coupled in series between the source of select transistor ST1 and the drain of select transistor ST2. The control gates of the memory cell transistors MT0 to MT7 in the same block BLK are coupled in common to respective word lines WL0 to WL7.

In the string units SU0 to SU3 in the same block BLK, the gates of the select transistors ST1 are coupled in common to respective select gate lines SGD0 to SGD3. The drains of the select transistors ST1 in the same row in the plurality of blocks BLK are coupled to corresponding bit lines BL.

The gates of the select transistors ST2 in the same block BLK are coupled in common to a select gate line SGS. The sources of the select transistors ST2 in each block BLK are coupled in common to the source line SL in the plurality of blocks BLK.

Memory cell transistors MT sharing a word line WL in one string unit SU are referred to as, for example, cell unit CU. The memory capacity of each cell unit CU varies based on the number of bits of data stored in the memory cell transistors MT.

For example, one cell unit CU can store 1-page data when each memory cell transistor MT stores 1-bit data, and can store 2-page data when each memory cell transistor MT stores 2-bit data.

Thus, "1-page data" is defined by, for example, the total amount of data stored in the cell unit CU of the memory cell transistors MT storing 1-bit data.

The memory cell array 10 included in the semiconductor memory 1 according to the first embodiment is not limited to the above-described configuration. For example, the number of memory cell transistors MT and the number of select transistors ST1 and ST2 included in each NAND string NS can be set in a discretionary manner. In addition, the number of string units SU included in each block BLK can be set in a discretionary manner.

(Circuit Configuration of Row Decoder Module 15)

FIG. 3 illustrates an example of a circuit configuration of a row decoder module 15 in the semiconductor memory 1 according to the first embodiment.

As illustrated in FIG. 3, the row decoder module 15 includes row decoders RD0 to RDn. The row decoders RD0 to RDn are associated with blocks BLK0 to BLKn, respectively.

Hereinafter, focusing on row decoder RD0 corresponding to block BLK0, an example of a detailed circuit configuration of the row decoder RD will be described. The row decoder RD includes a switch set SW and a block decoder BD.

The switch set SW includes high-breakdown-voltage n-channel MOS transistors TR1 to TR13. The gates of transistors TR1 to TR13 are coupled in common to a transfer gate line TG. The transistors TR1 to TR13 are coupled between various signal lines from the driver module 14 and various interconnects of the associated block BLK.

Specifically, for example, one end of transistor TR1 is coupled to the signal line SGSD. The other end of transistor TR1 is coupled to the select gate line SGS. One end of each of transistors TR2 to TR9 is coupled to each of signal lines CG0 to CG7, respectively. The other end of each of transistors TR2 to TR9 is coupled to one end of each of word lines WL0 to WL7, respectively. One end of each of transistors TRIO to TR13 is coupled to each of signal lines SGDD0 to SGDD3, respectively. The other end of each of transistors TRIO to TR13 is coupled to each of the select gate lines SGD0 to SGD3, respectively.

The block decoder BD decodes the block address BA. The block decoder BD applies a predetermined voltage to the transfer gate line TG based on a result of the decoding.

Figure 4:
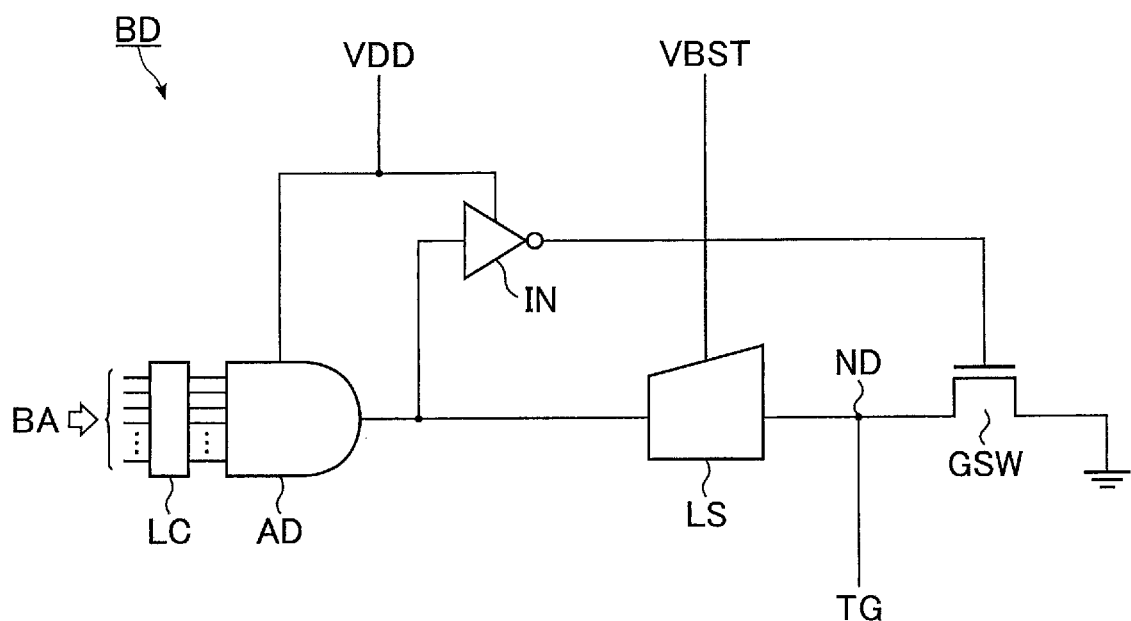
FIG. 4 is a circuit diagram illustrating an example of a circuit configuration of a block decoder included in the row decoder module in the semiconductor memory according to the first embodiment.

FIG. 4 illustrates an example of a detailed circuit configuration of the block decoder BD included in the row decoder module 15 in the semiconductor memory 1 according to the first embodiment.

As illustrated in FIG. 4, the block decoder BD includes, for example, a logic circuit LC, an AND circuit AD, an inverter IN, a level shifter LS, and a ground transistor GSW.

The block address BA transferred from the address register 12 is input into the logic circuit LC. A plurality of signals output from the logic circuit LC are input into the AND circuit AD.

For example, the logic circuit LC outputs "H" level signals when the inputted block address BA is the block address BA assigned to the block BLK to which the block decoder BD corresponds, and outputs "L" level signals when the inputted block address BA is other block address BA.

The AND circuit AD is driven based on, for example, source voltage VDD. The AND circuit AD outputs an AND calculation result of the inputted signals. The output signals of the AND circuit AD are input into the inverter IN and the level shifter LS.

For example, the AND circuit AD outputs "H" level signals when all input signals are of "H" level, and outputs "L" level signals when all input signals are of "L" level.

The inverter IN is driven based on, for example, source voltage VDD. The inverter IN inverts the inputted output signal of the AND circuit AD, and outputs the inverted signal. The output signal of the inverter IN is input into the gate of the ground transistor GSW.

Boost voltage VBST, for example, is supplied to the level shifter LS. Boost voltage VBST is, for example, a voltage higher than a program voltage applied to the control gate of the memory cell transistor MT during the write operation. The level shifter LS boosts the inputted output signal of the AND circuit AD with the boost voltage VBST being set as a target voltage, for example.

The level shifter LS applies the boosted voltage to the transfer gate line TG via the node ND. For example, the level shifter LS applies the ground voltage VSS to the transfer gate line TG when the "L" level signal is input, and applies the boost voltage VEST to the transfer gate line TG when the "H" level signal is input.

The ground transistor GSW is, for example, a high-breakdown-voltage n-channel MOS transistor. One end of the ground transistor GSW is coupled to the node ND. The other end of the ground transistor GSW is grounded.

For example, the ground transistor GSW is turned off when the inverter IN outputs the "L" level signal, and cuts off a current path between the node ND and the ground. In this case, the potential of the node ND is boosted to, for example, the boost voltage VBST based on the voltage output from the level shifter LS.

On the other hand, the ground transistor GSW is turned on when the inverter IN outputs the "H" level signal, and forms a current path between the node ND and the ground. In this case, the potential of the node ND is fixed to, for example, the ground voltage VSS.

As described above, the block decoder BD changes the voltage applied to the transfer gate line TG based on the block address BA.

For example, when the block BLK0 is selected, the block decoder BD in the row decoder RD0 applies the boost voltage VBST to the corresponding transfer gate line TG, and block decoders BD in other row decoders RD apply the ground voltage VSS to corresponding transfer gate lines TG.

In this manner, the transistors TR1 to TR13 included in the row decoder RD0 are turned on while the transistors TR1 to TR13 included in the other row decoders RD are turned off. In other words, current paths are formed between various interconnects provided in block BLK0 and the corresponding signal lines while current paths between various interconnects provided in other blocks BLK and corresponding signal lines are cut off.

As a result, the voltage applied to each signal line by the driver module 14 is applied to each of the various interconnects provided in the selected block BLK0 via the row decoder RD0. Thus, the semiconductor memory 1 according to the first embodiment can execute the operation in which a desired block BLK is selected based on the block address BA.

The row decoder module 15 in the semiconductor memory 1 according to the first embodiment is not limited to the above-described configuration. For example, the switch set SW or the block decoder BD may have a different circuit configuration.

(Circuit Configuration of Sense Amplifier Module 16)

FIG. 5 illustrates an example of a circuit configuration of a sense amplifier module 16 in the semiconductor memory 1 according to the first embodiment.

As illustrated in FIG. 5, the sense amplifier module 16 includes, for example, sense amplifier units SAU0 to SAUm.

The sense amplifier units SAU0 to SAUm are associated with bit lines BL0 to BLm, respectively. Each sense amplifier unit SAU includes, for example, a sense amplifier SA, and latch circuits SDL, ADL, BDL, CDL and XDL. The sense amplifier SA, and the latch circuits SDL, ADL, BDL, CDL and XDL are coupled in a manner such that they receive and transmit data between each other.

The sense amplifier SA senses, in the read operation, for example, data read to the corresponding bit line BL, and determines whether the read data is "0" or "1". Each of the latch circuits SDL, ADL, BDL, CDL and XDL temporarily holds read data, write data, etc.

The latch circuit XDL is coupled to an input/output circuit (not shown), and is used to input/output data between the sense amplifier unit SAU and the input/output circuit. That is, the latch circuit XDL functions as, for example, a cache memory of the semiconductor memory 1. For example, even when the latch circuits SDL, ADL, BDL, and CDL are in use, if the latch circuit XDL is vacant, the semiconductor memory 1 can be in a ready state.

Figure 6:
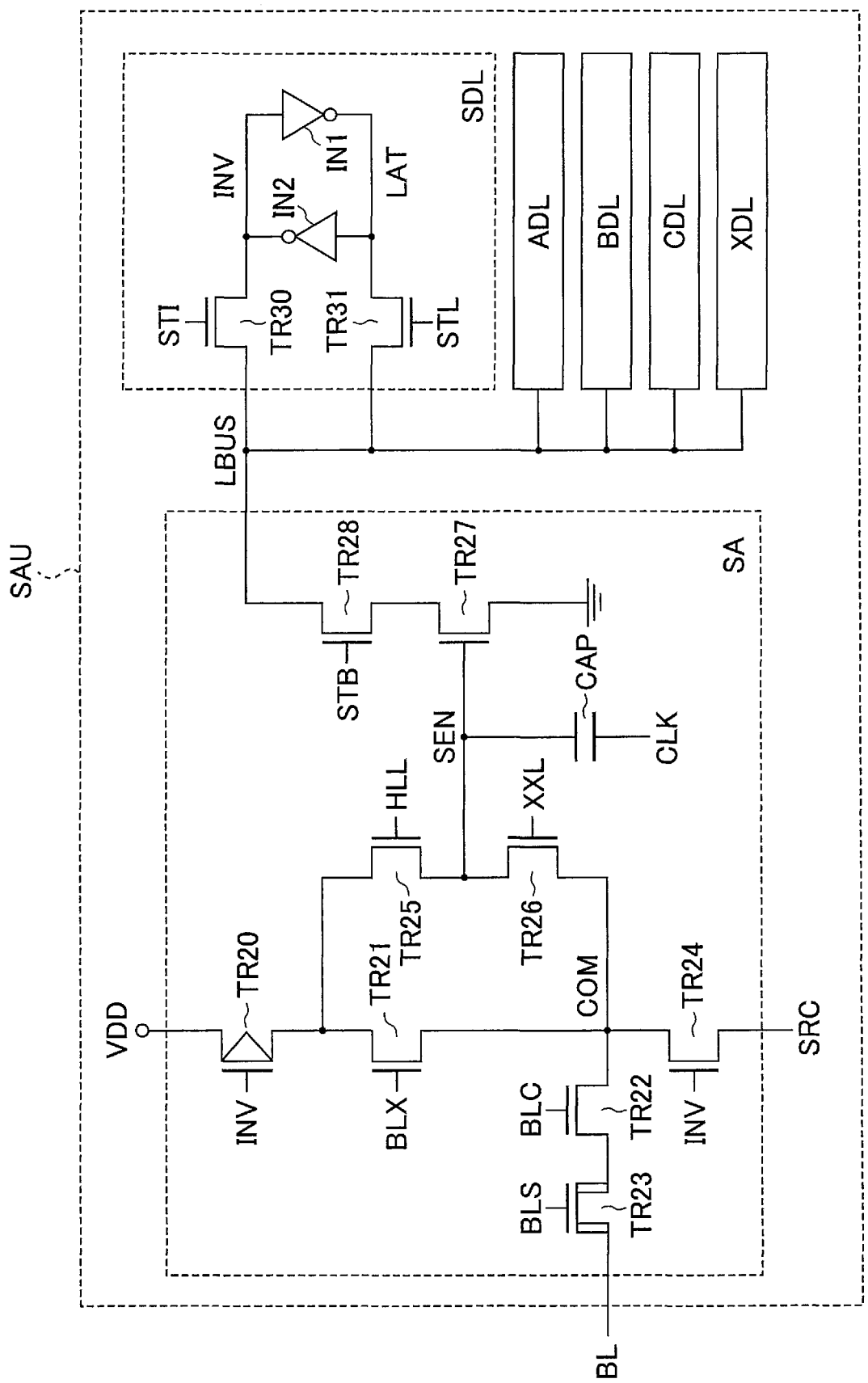
FIG. 6 is a circuit diagram illustrating an example of a circuit configuration of a sense amplifier unit included in the sense amplifier module in the semiconductor memory according to the first embodiment.

FIG. 6 illustrates an example of a detailed circuit configuration of the sense amplifier unit SAU included in the sense amplifier module 16 in the semiconductor memory 1 according to the first embodiment.

As illustrated in FIG. 6, the sense amplifier SA includes, for example, a p-channel MOS transistor TR20, re-channel. MOS transistors TR21 to TR28, and a capacitor CAP. The latch circuit SDL includes, for example, inverters IN1 and IN2, and n-channel MOS transistors TR30 and TR31. The circuit configurations of the latch circuits ADL, BDL and XDL are similar to, for example, the circuit configuration of the latch circuit SDL; thus, a description will be omitted.

One end of the transistor TR20 is coupled to a power line. The gate of the transistor TR20 is coupled to a node INV. The source voltage VDD, for example, is applied to the power line coupled to one end of the transistor TR20.

One end of the transistor TR21 is coupled to the other end of the transistor TR20. The other end of the transistor TR21 is coupled to a node COM. A control signal BLX is input into the gate of the transistor TR21.

One end of the transistor TR22 is coupled to the node COM. A control signal BLC is input into the gate of the transistor TR22.

The transistor TR23 is, for example, a high-breakdown-voltage n-channel MOS transistor. One end of the transistor TR23 is coupled to the other end of the transistor TR22. The other end of the transistor TR23 is coupled to the corresponding bit line BL. A control signal BLS is input into the gate of the transistor TR23.

One end of the transistor TR24 is coupled to the node COM. The other end of the transistor TR24 is coupled to the node SRC. The gate of the transistor TR24 is coupled to the node INV. The ground voltage VSS, for example, is applied to the node SRC.

One end of the transistor TR25 is coupled to the other end of the transistor TR20. The other end of the transistor TR25 is coupled to the node SEN. A control signal HLL is input into the gate of the transistor TR25.

One end of the transistor TR26 is coupled to the node SEN. The other end of the transistor TR26 is coupled to the node COM. A control signal XXL is input into the gate of the transistor TR26.

One end of the transistor TR27 is grounded. The gate of the transistor TR27 is coupled to the node SEN.

One end of the memory cell transistor TR28 is coupled to the other end of the transistor TR27. The other end of the transistor TR28 is coupled to a bus LBUS. A control signal STB is input into the gate of the transistor TR28. One end of the capacitor CAP is coupled to the node SEN. A clock CLK is input into the other end of the capacitor CAP.

The input node of the inverter IN1 is coupled to a node LAT. The output node of the inverter IN1 is coupled to a node INV. The input node of the inverter IN2 is coupled to the node INV. The output node of the inverter IN2 is coupled to the node LAT.

One end of the transistor TR30 is coupled to the node INV. The other end of the transistor TR30 is coupled to the bus LBUS. A control signal STI is input into the gate of the transistor TR30.

One end of the transistor TR31 is coupled to the node LAT. The other end of the transistor TR31 is coupled to the bus LBUS. A control signal STL is input into the gate of the transistor TR31.

Each of the above-described control signals BLX, BLC, BLS, HLL, XXL, and STB is generated by, for example, the sequencer 13. The timing at which the sense amplifier SA determines the data read to the bit line BL is based on the timing at which the control signal STB is asserted.

The sense amplifier module 17 in the semiconductor memory 1 according to the first embodiment is not limited to the above-described configuration. For example, the number of latch circuits included in the sense amplifier unit SAU can be appropriately changed based on an applied write scheme.

[1-1-3] Structure of Semiconductor Memory 1

Hereinafter, a description will be given of an example of the structure of the semiconductor memory 1 according to the first embodiment.

The semiconductor memory 1 according to the first embodiment has a structure in which a circuit such as the sense amplifier module 16 is provided between the semiconductor substrate and the memory cell array 10.

Hereinafter, in the semiconductor memory 1 according to the first embodiment, a portion including a layer provided with the memory cell array 10 will be referred to as an upper part UL of the semiconductor memory 1. A portion including a layer provided with the sense amplifier module 16, etc., will be referred to as a lower part LL of the semiconductor memory 1.

In the drawings referred to in the following, X direction corresponds to the extending direction of word lines WL, Y direction corresponds to the extending direction of bit lines BL, and Z direction corresponds to a direction perpendicular to the surface of the semiconductor substrate 30 in which the semiconductor memory 1 is formed. For viewability, in the cross-section, elements such as insulation layers (interlayer insulating films), interconnects, and contacts are suitably omitted.

(Planer Layout of Semiconductor Memory 1)

Figure 7:
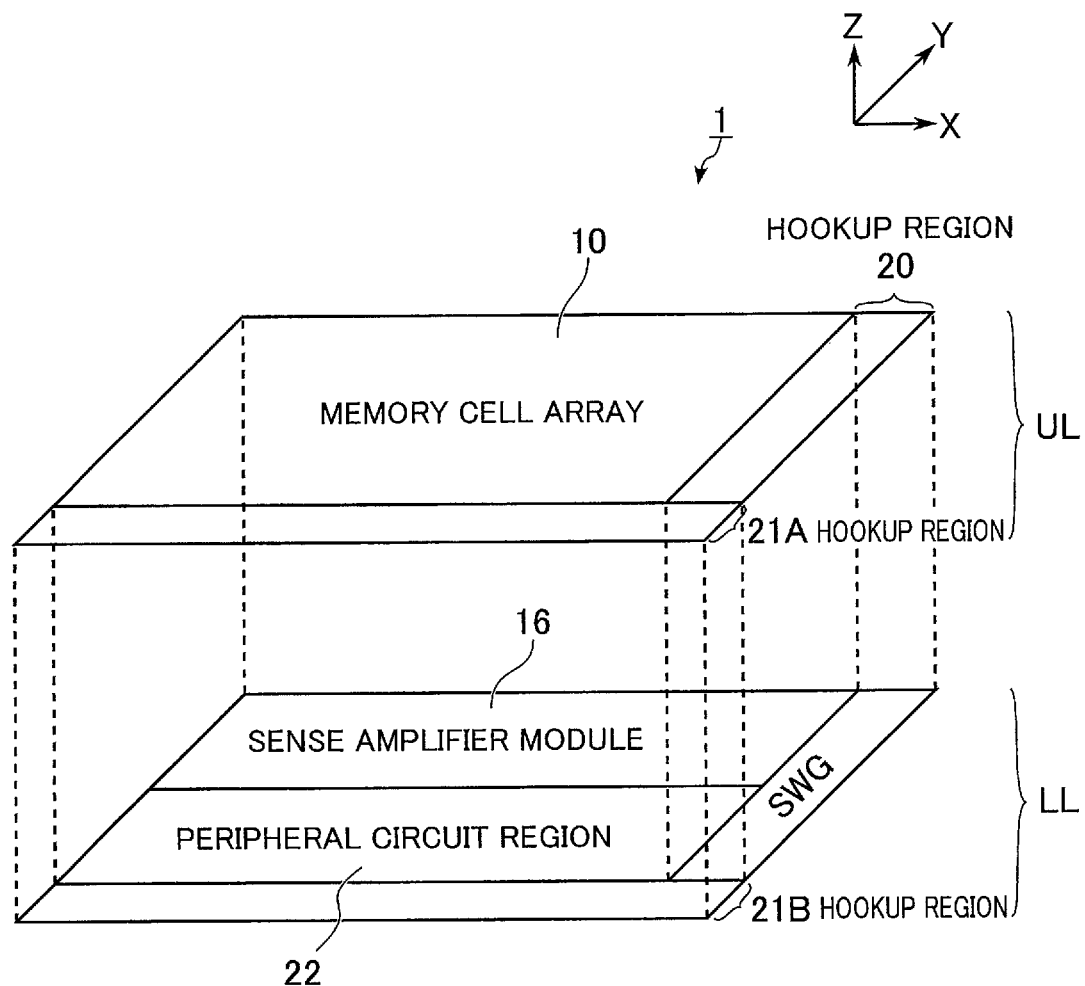
FIG. 7 is a plan view illustrating an example of a planer layout of an upper part and a lower part in the semiconductor memory according to the first embodiment.

FIG. 7 illustrates an example of a planer layout of the upper part UL and the lower part LL in the semiconductor memory 1 according to the first embodiment.

As illustrated in FIG. 7, the semiconductor memory 1 includes, in the upper part UL, for example, the memory cell array 10, and hookup regions 20 and 21A. The semiconductor memory 1 includes, in the lower part LL, for example, the sense amplifier module 16, a hookup region 21B, a peripheral circuit region 22, and a switch set group SWG.

The memory cell array 10 region is, for example, adjacent to the hookup region 20 in the X direction, and adjacent to the hookup region 21A in the Y direction. Moreover, the memory cell array 10 region overlaps the sense amplifier module 16 and the peripheral circuit region 22.

The sense amplifier module 16 region is, for example, provided to extend in the X direction, and adjacent to the switch set group SWG in the X direction. The peripheral circuit region 22 is, for example, provided to extend in the X direction, adjacent to the switch set group SWG in the X direction, and adjacent to the sense amplifier module 16 region in the Y direction. The switch set group SWG includes a plurality of switch sets SW corresponding to respective blocks BLK.

The hookup region 20 overlaps the switch set group SWG. The hookup region 20 is provided with, for example, interconnects and contacts for coupling the interconnects (e.g., word lines WL) drawn out from the end portion of the memory cell array 10 in the upper part UL, and the switch set group SWG provided in the lower part LL.

The hookup region 21A overlaps the hookup region 21B. The hookup regions 21A and 21B are, for example, regions for drawing out the circuit provided in the peripheral circuit region 22 to the upper part UL side. The peripheral circuit region 22 includes, for example, the sequencer 13, an input/output circuit for communication between the semiconductor memory 1 and the memory controller 2, etc.

Figure 8:
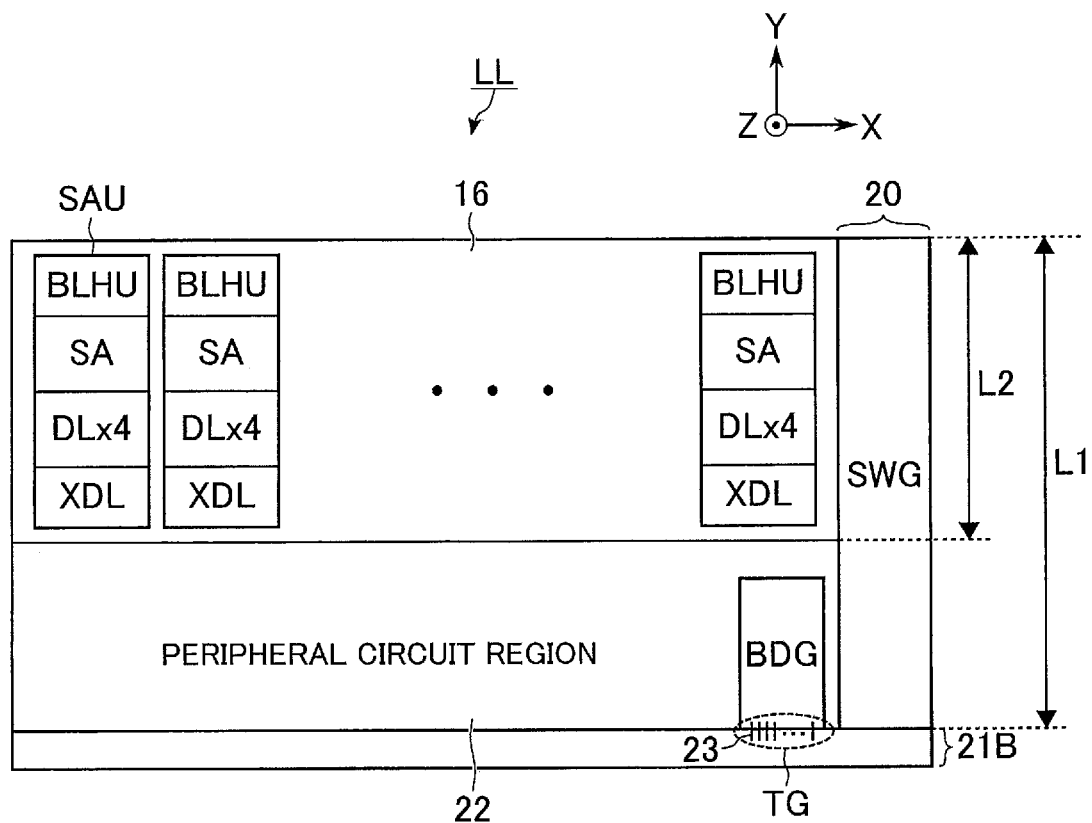
FIG. 8 is a plan view illustrating an example of a planer layout in the lower part of the semiconductor memory according to the first embodiment.

FIG. 8 illustrates an example of a more detailed planer layout of the lower part LL in the semiconductor memory 1 according to the first embodiment.

As illustrated in FIG. 8, width L1 of the switch set group SWG region in the Y direction is longer than width L2 of the sense amplifier module 16 region in the Y direction. The width L1 of the switch set group SWG region in the Y direction is, for example, approximately equal to the width of the memory cell array 10 region in the Y direction. In the semiconductor memory 1 according to the first embodiment, the width L2 is designed, for example, to be equal to or longer than a half of the width L1.

In the sense amplifier module 16 region, a plurality of sense amplifier units SAU are aligned in the Y direction. Each sense amplifier unit SAU region is provided with a bit line hookup region BLHU, a sense amplifier SA, four latch circuits DLx4 (e.g., latch circuits SDL, ADL, BDL, and CDL), and a latch circuit XDL, aligned in the Y direction.

The bit line hookup region BLHU is a region for coupling the bit line BL provided in the memory cell array 10 and the sense amplifier unit SAU. The contact that electrically couples the circuit provided in the region BLHU and the bit line BL in the memory cell array 10 is formed to pass through, for example, the inside of the memory region MR. The layout inside the sense amplifier module 16 is not limited to this, and may be other layout. For example, a plurality of sense amplifier units SAU may be aligned in the Y direction.

The switch set group SWG includes a portion adjacent to the sense amplifier module 16. Specifically, in the portion where the switch set group SWG and the sense amplifier module 16 are adjacent, a transistor (e.g., transistor TR2) in the switch set SW is adjacent to the sense amplifier module 16.

The peripheral circuit region 22 includes a block decoder group BDG, and a plurality of interconnects 23. The block decoder group BDG includes a plurality of block decoders BD corresponding to respective blocks BLK. The block decoder group BDG region is, for example, adjacent to the hookup region 21B in the Y direction.

The plurality of interconnects 23 are coupled to the block decoder group BDG. Specifically, the plurality of interconnects 23 are coupled to respective block decoders BD included in the block decoder group BDG, and each functions as the transfer gate line TG. One end of each of the interconnects 23 is drawn out into the hookup region 21B.

FIG. 9 illustrates an example of a detailed planer layout of the block decoder group included in the row decoder module 15 in the semiconductor memory 1 according to the first embodiment, by extracting eight blocks BLK0 to BLK7.

As illustrated in FIG. 9, the region where the block decoder group BDG is provided includes, for example, a high-breakdown-voltage NMOS region HVN, a high-breakdown-voltage PMOS region HVP, a low-breakdown-voltage NMOS region LVN, and a low-breakdown-voltage PMOS transistor region LVP.

The high-breakdown-voltage NMOS region HVN, the high-breakdown-voltage PMOS region HVP, the low-breakdown-voltage NMOS region LVN, and the low-breakdown-voltage PMOS region LVP are, for example, aligned in the Y direction, and an element isolation region ISO is provided between adjacent regions.

The element isolation region ISO isolates different well regions formed on the semiconductor substrate. Although illustration is omitted, the element isolation region ISO may be provided to surround the high-breakdown-voltage NMOS region HVN, the high-breakdown-voltage PMOS region HVP, the low-breakdown-voltage NMOS region LVN, and the low-breakdown-voltage PMOS transistor region LVP. The element isolation region ISO may be partially omitted. For example, the element isolation region ISO between the low-breakdown-voltage NMOS region LVN and the low-breakdown-voltage PMOS region LVP may be omitted.

The high-breakdown-voltage NMOS region HVN is formed in a p-type well region formed on the semiconductor substrate, and is a region where the high-breakdown-voltage n-channel MOS transistor is formed. The high-breakdown-voltage PMOS region HVP is formed in an n-type well region formed on the semiconductor substrate, and is a region where the high-breakdown-voltage p-channel MOS transistor is formed.

The low-breakdown-voltage NMOS region LVN is formed in a p-type well region formed on the semiconductor substrate, and is a region where the low-breakdown-voltage n-channel MOS transistor is formed. The low-breakdown-voltage PMOS transistor region LVP is formed in an n-type well region formed on the semiconductor substrate, and is a region where the low-breakdown-voltage p-channel MOS transistor is formed.

The regions HVN, HVP, LVN and LVP each include, for example, circuit regions corresponding to blocks BLK0 to BLK7. The circuit regions are provided with circuits constituting block decoders BD corresponding to the blocks BLK.

In the example illustrated in FIG. 9, the first circuit region corresponding to blocks BLK0 to BLK3 is aligned in the Y direction. The second circuit region corresponding to blocks BLK4 to BLK 7 is arranged adjacent to the first circuit region in the X direction.

In this case, for example, the circuits corresponding to blocks BLK1, BLK2, BLK5 and BLK6 are arranged not adjacent to the element isolation region ISO in the Y direction. The arrangement is not limited to this, and the arrangement inside the regions HVN, HVP, LVN and LVP may be suitably changed. The circuit in the block decoder BD may be shared in separate blocks BLK. For example, the circuit corresponding to the level shifter LS in the region may be shared in separate blocks BLK.

The regions HVN, HVP, LVN and LVP may be arranged in a different order. The regions HVN, HVP, LVN and LVP do not necessarily have to be aligned in the Y direction, and may be arranged in a discretionary manner in the block decoder group BDG region.

FIG. 10 illustrates an example of the detailed planer layout of the upper part UL in the semiconductor memory 1 according to the first embodiment.

As illustrated in FIG. 10, the region where the memory cell array 10 is provided includes a plurality of interconnects 24 and a plurality of interconnects 25. The number of interconnects 24 or interconnects 25 is, for example, equal to the number of interconnects 23. The interconnects 24 and 25 are electrically coupled to the corresponding interconnects 23, and function as the transfer gate line TG.

Specifically, for example, the interconnects 24 have a portion extending in the Y direction, and a portion overlapping the hookup region 21A. The plurality of interconnects 24 are aligned in the X direction. Each interconnect 24 is electrically coupled to the corresponding interconnect 23 in the hookup region 21A.

For example, the interconnects 25 have a portion extending in the X direction and a portion overlapping the hookup region 20. The plurality of interconnects 25 are aligned in the Y direction. The interconnects 25 are electrically coupled to the corresponding switch set SW (e.g., gates of transistors TR1 to TR13) in the hookup region 20.

In the semiconductor memory 1 according to the first embodiment, a plurality of transistors in the switch set group SWG include, for example, those in which a distance from the level shifter LS in the corresponding block decoder BD is equal to or longer than a half of the length of one bit line BL in the Y direction.

As descried with reference to FIG. 8 to FIG. 10, the switch set group SWG (e.g., transistor TR2) is arranged along the first side of the rectangular region where the memory cell array 10 is provided. The block decoder group BDG (e.g., level shifter LS) is arranged along the second side different from the first side of the rectangular region where the memory cell array 10 is provided. The transfer gate line TG including sets of interconnects 24 and 25 intersects with the first side and the second side of the memory cell array 10.

Figure 11:
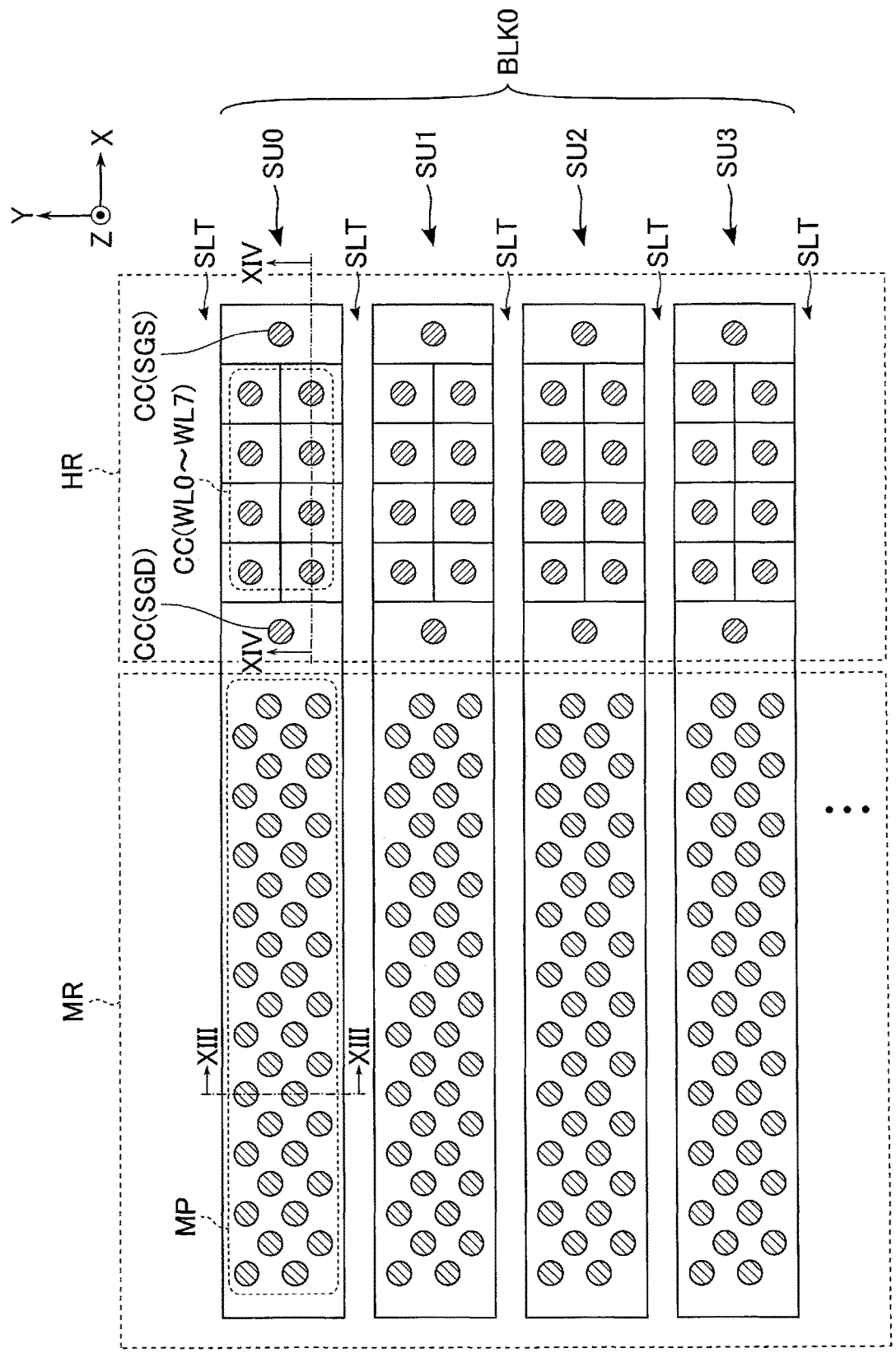
FIG. 11 is a plan view illustrating an example of a planer layout of the memory cell array in the semiconductor memory according to the first embodiment.

FIG. 11 illustrates an example of a planer layout of the memory cell array 10 in the semiconductor memory 1 according to the first embodiment, by extracting the structure corresponding to block BLK0 out of the plurality of blocks BLK aligned in the Y direction.

As illustrated in FIG. 11, for example, the structures corresponding to string units SU0 to SU3 in block BLK0 are each provided to extend in the X direction, and are aligned in the Y direction. For example, a slit SLT extending in the X direction is provided between string units SU adjacent in the Y direction.

In other words, a plurality of slits SLT extending in the X direction are aligned in the Y direction. The structure between the slits SLT adjacent in the Y direction corresponds to one string unit SU. A plurality of string units SU may be provided between adjacent slits SLT.

The region where the structure corresponding to the memory cell array 10 is provided is categorized into, for example, a memory region MR and a hookup region HR. First, the detailed structure of the memory region MR of the memory cell array 10 will be described.

The memory region MR is a region mainly for holding data. In the memory region MR, a plurality of memory pillars MP are provided For example, the plurality of memory pillars MP are arranged in a staggered manner when viewed in the Z direction. Each of the memory pillars MP functions as, for example, one NAND string NS. The number of memory pillars MP illustrated in FIG. 11 is schematic, and is not limited to the number illustrated.

Figure 12:
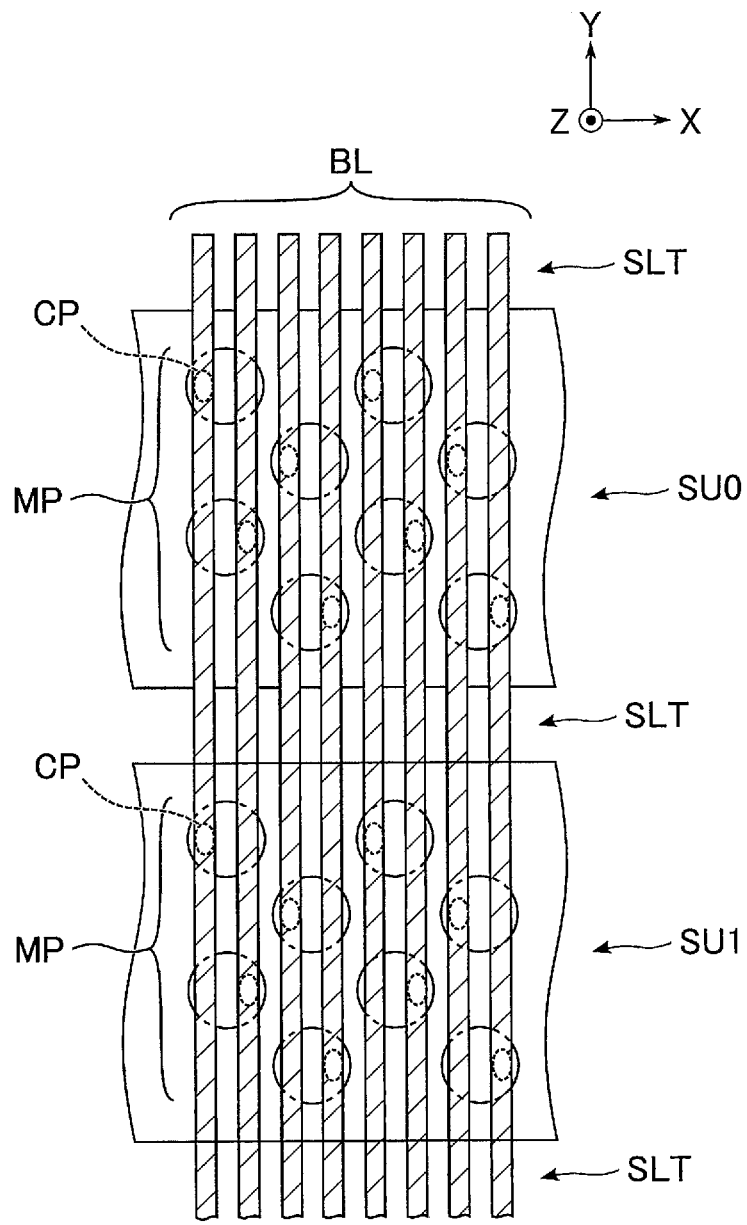
FIG. 12 is a plan view illustrating an example of a detailed planer layout in a memory region of the memory cell array in the semiconductor memory according to the first embodiment.

FIG. 12 illustrates an example of a detailed planer layout in the memory region MR of the memory cell array 10 in the semiconductor memory 1 according to the first embodiment, by extracting the structures corresponding to string units SU0 and SU1.

As illustrated in FIG. 12, in the memory cell array 10, a plurality of bit lines BL and a plurality of contacts CP are arranged to correspond to the positions of the memory pillars MP.

The plurality of bit lines BL extend in the Y direction, and are aligned in the X direction. For example, two bit lines BL overlap each memory pillar MP. The number of bit lines BL that overlap each memory pillar MP may be designed in a discretionary manner.

Each contact CP is provided between the corresponding bit line BL and memory pillar MP. Each memory pillar MP is electrically coupled to one bit line BL via the contact CP. If a plurality of bit lines BL overlap one memory pillar MP, the contact CP is provided between one bit line BL of bit lines BL overlapping the memory pillar MP and the memory pillar MP.

Returning back to FIG. 11, details of the hookup region HR of the memory cell array 10 will be described. The hookup region HR is a region for electrically coupling the various interconnects coupled to the memory cell, etc., in the memory region MR and the row decoder module 15.

In the hookup region HR, a plurality of interconnect layers corresponding to the select gate line SGS, the word lines WL0 to WL7, and the select gate line SGD have portions not overlapping upper interconnect layers. For example, the end portions of the interconnect layers corresponding to the word lines WL are provided in a two-row stepwise manner.

The hookup region HR is provided with, for example, contacts CC corresponding to the select gate line SGS, the word lines WL0 to WL7, and the select gate line SGD. Each of the select gate line SGS, the word lines WL0 to WL7, and the select gate line SGD is electrically coupled to the row decoder module 15 via the corresponding contact CC.

(Cross-sectional Structure of Semiconductor Memory 1)

Figure 13:
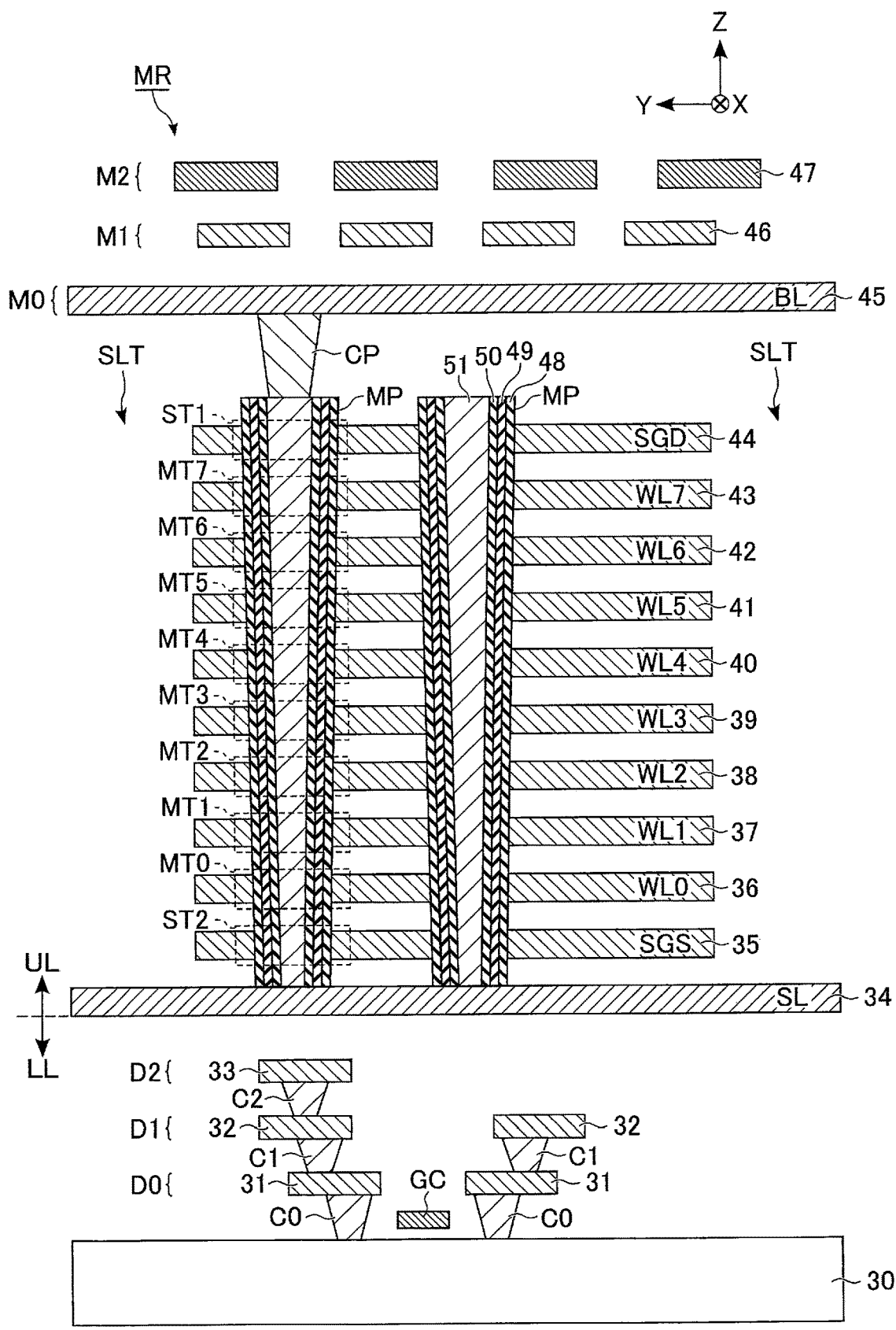
FIG. 13 is a cross-sectional view illustrating an example of a cross-sectional structure in the memory region of the memory cell array in the semiconductor memory according to the first embodiment.

FIG. 13 illustrates an example of the cross-sectional structure in the memory region MR of the memory cell array 10 in the semiconductor memory 1 according to the first embodiment, and corresponds to the cross-sectional structure of the semiconductor memory 1 taken along line XIII-XIII in FIG. 11.

As illustrated in FIG. 13, the semiconductor memory 1 includes, in the memory region MR, for example, a semiconductor substrate 30, conductors 31 to 47, memory pillars MP, and contacts C0, C1, C2 and CP. The drawings referred to in the following description omit illustration of the p-type or n-type well region formed on the surface portion of the semiconductor substrate 30, illustration of the impurity diffusion region formed in each well region, or illustration of the element isolation region isolating the well regions.

In the memory region MR, for example, a plurality of contacts C0 are formed on the semiconductor substrate 30. The plurality of contacts C0 are coupled to the impurity diffusion region (not shown) provided in the semiconductor substrate 30. A conductor 31 is provided on the contact C0. For example, a gate electrode GC is provided in the vicinity of the region between adjacent conductors 31, and one of the adjacent conductors 31 corresponds to the drain of the transistor while the other conductor 31 corresponds to the source of the transistor.

A contact C1, for example, is provided on the conductor 31. A conductor 32, for example, is provided on the contact C1. A contact C2, for example, is provided on the conductor 32. A conductor 33, for example, is provided on the contact C2.

The above-described circuit is included in, for example, the sense amplifier module 16. Hereinafter, interconnect layers provided with the conductors 31 to 33 will be referred to as interconnect layers D0 to D2, respectively. The interconnect layers D0 to D2 are included in the lower part LL of the semiconductor memory 1.

A conductor 34, for example, is provided above the conductor 33 via an interlayer insulating film. For example, the conductor 34 is formed to have a plate shape parallel to the XY plan, and corresponds to the source line SL.

For example, conductors 35 to 44 are stacked in order above the conductor 34 to correspond to each string unit SU. Between conductors adjacent in the Z direction of these conductors, an interlayer insulating film (not shown) is provided.

The structure corresponding to one string unit SU is provided between adjacent slits SLT. The slits SLT extend, for example, in the X and Z directions, and isolate the conductors 35 to 44 provided in adjacent string units SU (not shown).

Each of the conductors 35 to 44 is formed to have a plate shape parallel to, for example, the XY plan. For example, the conductor 35 corresponds to the select gate line SGS, the conductors 36 to 43 correspond to the word lines WL0 to WL7, respectively, and the conductor 44 corresponds to the select gate line SGD.

Each memory pillar MP is provided to have a pillar shape passing through the conductors 35 to 44, and is in contact with the conductor 34. The memory pillar MP includes, for example, a block insulating film 48, an insulating film 49, a tunnel oxide film 50, and a semiconductor material 51.

The insulating film 48 is provided on the inner wall of a memory hole formed in the manufacturing process of the semiconductor memory 1. The insulating film 49 is formed on the inner wall of the block insulating film 48. The insulating film 49 functions as a charge accumulation layer of the memory cell transistor MT. The tunnel oxide film 50 is formed on the inner wall of the insulating film 49. The semiconductor material 51 is provided on the inner wall of the tunnel oxide film 50. The semiconductor material 51 includes a conductive material, and functions as a current path of the NAND string NS. A different material may be further formed on the inner wall of the semiconductor material 51.

For example, the portion where the memory pillar MP and the conductor 35 intersect functions as the select transistor ST2. The portions where the memory pillar MP and the conductors 35 to 43 intersect function as memory cell transistors MT0 to MT7. The portion where the memory pillar MP and the conductor 44 intersect functions as the select transistor ST1.

The conductor 45 is provided in a layer higher than the top surface of the memory pillar MP via the interlayer insulating film. The conductor 45 is formed to be linear extending in the Y direction, and corresponds to the bit line BL. A plurality of conductors 45 are aligned in the X direction (not shown). The conductor 45 is electrically coupled to one memory pillar MH corresponding to each string unit SU.

Specifically, in each string unit SU, for example, a contact CP is provided on the semiconductor material 51 in each memory pillar MP, and one conductor 45 is provided on the contact CP. The configuration is not limited to this, and the memory pillar MP and the conductor 45 may be coupled via a plurality of contacts, interconnects, etc.

A conductor 46 is provided above the layer provided with the conductor 45 via an interlayer insulating film. A conductor 47 is provided, via an interlayer insulating film, above the layer provided with the conductor 46.

The conductors 46 and 47, for example, correspond to the interconnects for coupling the interconnect provided in the memory cell array 10 and the peripheral circuit provided under the memory cell array 10. The conductors 46 and 47 may be coupled by a pillar contact. In the following, the layer provided with the conductor 45 will be referred to as interconnect layer M0, the layer provided with the conductor 46 will be referred to as interconnect layer M1, and the layer provided with the conductor 47 will be referred to as interconnect layer M2.

Figure 14:
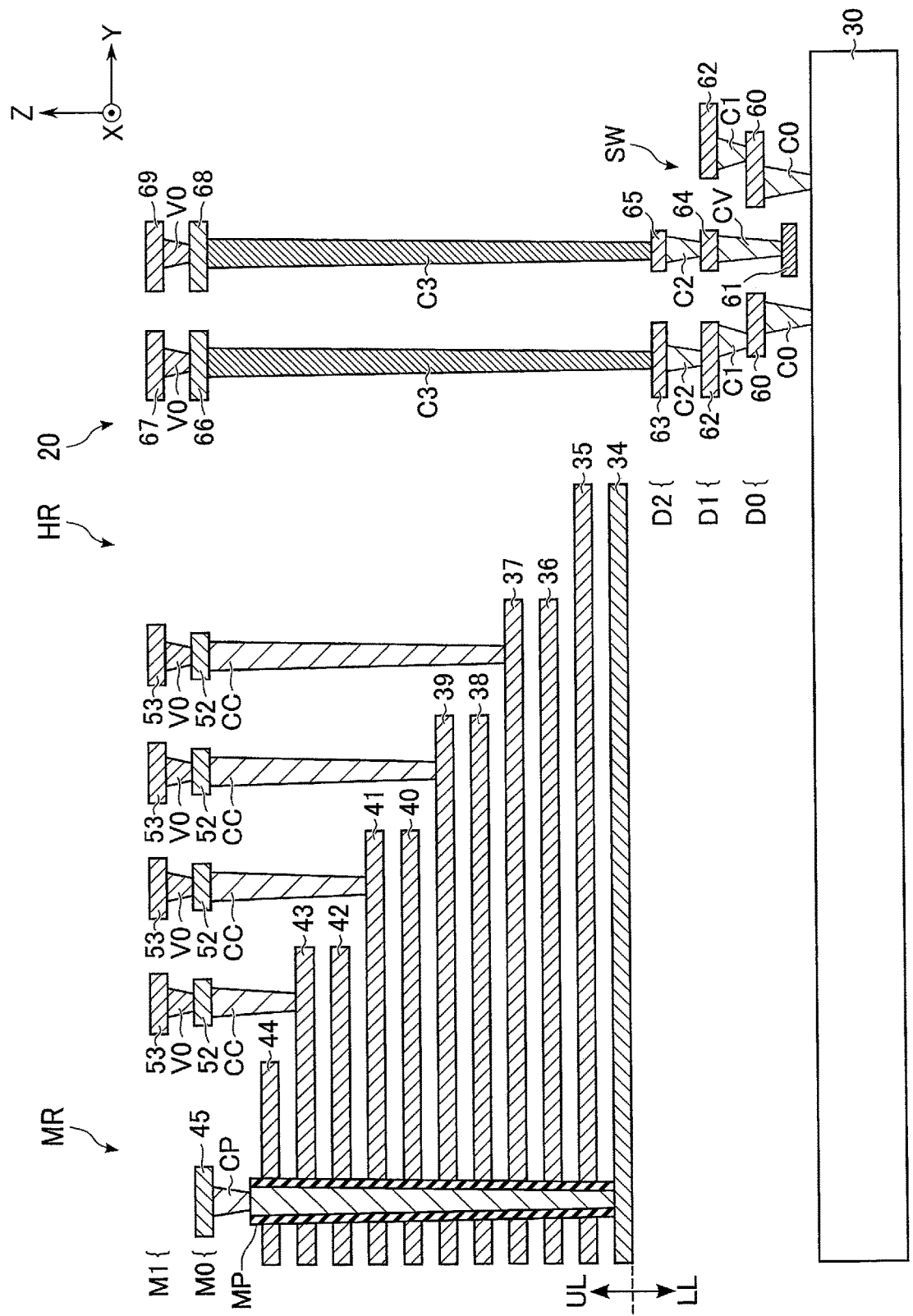
FIG. 14 is a plan view illustrating an example of a cross-sectional structure in a hookup region of the memory cell array in the semiconductor memory according to the first embodiment.

FIG. 14 illustrates an example of the cross-sectional structure in the hookup regions HR and 20 of the memory cell array 10 in the semiconductor memory 1 according to the first embodiment, and corresponds to the cross-sectional structure of the semiconductor memory 1 taken along line XIV-XIV in FIG. 11.

As illustrated in FIG. 14, the semiconductor memory 1 includes, in the hookup region HR, for example, a semiconductor substrate 30, end portions of conductors 34 to 44 provided in the memory region MR, conductors 52 and 53, and contacts CC.

The conductors 52 and 53 are interconnects for coupling each interconnect drawn out to the hookup region HR from the memory region MR and the row decoder module 15. A plurality of conductors 52 are provided to correspond to the conductors 35 to 44, respectively. In the region illustrated in FIG. 14, for example, contacts CC(WL1), CC(WL3), CC(WL5), and CC(WL7) are provided at the end portions of conductors 37, 39, 41, and 43, respectively.

Although illustration is omitted in FIG. 14, contacts CC(WL0), CC(WL2), CC(W4) and CC(WL6) are provided at the end portions of the conductors 36, 38, 40, and 42 in different locations in the X direction from those of the contacts CC(WL1), CC(W3), CC(WL5) and CC(WL7).

Similarly, the contacts CC(SGS) and CC(SGD) are provided at the end portions of the conductors 35 and 44, respectively.

Each contact is coupled to the corresponding conductor 52. A conductor 53 is provided above each conductor 52. A contact V0, for example, is provided between the corresponding conductor 52 and conductor 53.

The semiconductor memory 1 includes, in the hookup region 20, for example, a semiconductor substrate 30, conductors 60 to 69, and contacts C0, C1, C2, CV and V0. The conductors 60 to 65 are included in the circuit constituting the switch set SW.

In the hookup region 20, for example, a plurality of contacts C0 are provided on the semiconductor substrate 30. The plurality of contacts C0 are coupled to the impurity diffusion region (not shown) provided in the semiconductor substrate 30.

A conductor 60 is provided on the contact C0. For example, a conductor 61 is provided in the vicinity of the region between the adjacent conductors 31. A contact C1, for example, is provided on the conductor 60. A conductor 62, for example, is provided on the contact C1. A contact C2, for example, is provided on the conductor 62. A conductor 63, for example, is provided on the contact C2. A contact CV, for example, is provided on the conductor 61. A conductor 64, for example, is provided on the contact CV. A conductor 65, for example, is provided on the conductor 64.

The above-described configuration corresponds to an example of the structure of the semiconductor memory 1 in the hookup region 20 and the lower part LL. For example, a set of the adjacent conductors 60 and the conductor 61 therebetween is used as one of the transistors TR1 to TR13 included in the switch set SW. In this case, one of the adjacent conductors 60 corresponds to the drain of the transistor while the other conductor 60 corresponds to the source of the transistor. For example, one of the signal lines CG0 to CG7, SGDD0 to SGDD3, and SGSD is electrically coupled to the conductor corresponding to the drain of the transistor.

A conductor 66 included in the interconnect layer M0 is provided above the conductor 63. A contact C3 is provided between the conductor 63 and the conductor 66. The contact C3 is a contact for electrically coupling the interconnect provided in the upper part UL of the semiconductor memory 1 and the interconnect provided in the lower part LL. A conductor 67 is provided above the conductor 66. A contact V0 is provided between the conductor 66 and the conductor 67.

Similarly, a conductor 68 included in the interconnect layer M0 is provided above the conductor 65. A contact C3 is provided between the conductor 65 and the conductor 68. A conductor 69 is provided above the conductor 68. A contact V0 is provided between the conductor 68 and the conductor 69.

The conductor 67 is electrically coupled to the corresponding conductor 53 via a region (not shown). That is, the conductor 67 is an interconnect electrically coupled to one end of the transistor in the switch set SW.

The conductor 69 includes a portion extending in the X direction in a region (not shown), and functions as the interconnect 25. That is, the conductor 69 is a part of the transfer gate line TG electrically coupled to the gates of the transistors in the switch set SW.

With the above-described structure of the semiconductor memory 1, the select gate line SGS, the word lines WL0 to WL7, and the select gate line SGD are electrically coupled to the row decoder module 15 via the corresponding contacts and interconnects.

The region where the switch set SW is provided may be included in the hookup region HR or the memory region MR of the memory cell array 10. That is, the switch set group SWG may be arranged under the memory cell array 10. The number of conductors or contacts electrically coupling the conductor 61 and the conductor 69 may be designed in a discretionary manner. The conductors 61, 64, 65, 68 and 69 or the contacts CV, C3 and V0 may be shared in the plurality of transistors sharing the transfer gate line TO. In this case, at least one of the conductors 61, 64, 65, 68 and 69 includes, for example, a portion extending in the X direction, i.e., a portion extending in a direction intersecting with the word line WL direction.

Figure 15:
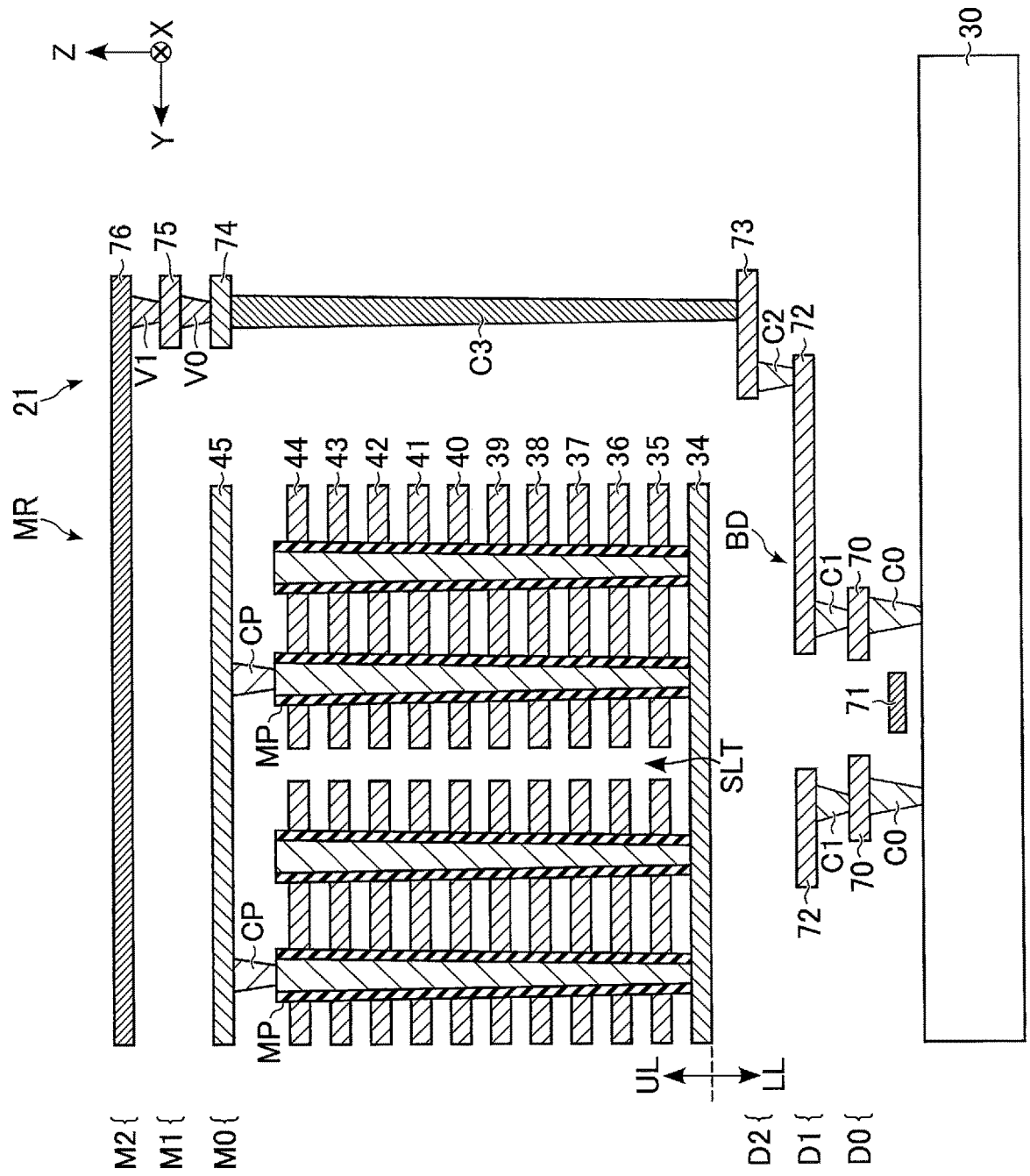
FIG. 15 is a cross-sectional view illustrating an example of a cross-sectional structure of the memory cell array and the block decoder group in the semiconductor memory according to the first embodiment.

FIG. 15 illustrates an example of a cross-sectional structure of the memory cell array 10 and the block decoder BD in the semiconductor memory 1 according to the first embodiment. The structure of the memory region MR illustrated in FIG. 15 is similar to that of the memory cell array 10 described with reference to FIG. 13.

As illustrated in FIG. 15, in the end region of the memory region MR and the hookup region 21, the semiconductor memory 1 includes, for example, a semiconductor substrate 30, conductors 70 to 76, and contacts C0, C1, C2, V0 and V1. The conductors 70 to 73 are included in the circuit constituting the block decoder BD.

In the end region of the memory region MR and the hookup region 21, for example, a plurality of contacts C0 are provided on the semiconductor substrate 30. The plurality of contacts C0 are coupled to the impurity diffusion region (not shown) provided in the semiconductor substrate 30.

A conductor 70 is provided on the contact C0. A conductor 71, for example, is provided in the vicinity of the region between the adjacent conductors 70. A contact C1, for example, is provided on the conductor 70. A conductor 72, for example, is provided on the contact C1. A contact C2, for example, is provided on the conductor 72. A conductor 73, for example, is provided on the contact C2.

For example, a set of the adjacent conductors 70 and the conductor 71 therebetween is used as a transistor in the level shifter LS included in the block decoder BD. In this case, one of the adjacent conductors 70 corresponds to the drain of the transistor while the other conductor 70 corresponds to the source of the transistor.

A conductor 74 included in the interconnect layer M0 is provided above the conductor 73. A contact C3 is provided between the conductor 73 and the conductor 74. A conductor 75 is provided above the conductor 74. A contact V0 is provided between the conductor 74 and the conductor 75. A conductor 76 is provided above the conductor 75. A contact V1 is provided between the conductor 75 and the conductor 76.

The conductor 67 includes a portion extending in the Y direction, and corresponds to the interconnect 24. That is, the conductor 76 is a part of the transfer gate line TG electrically coupled to the gate of the transistor in the switch set SW.

As described above, in the semiconductor memory 1 according to the first embodiment, the transfer gate line TG coupled to the block decoder BD provided under the memory cell array 10 passes over the memory cell array 10 via the hookup region 21. The transfer gate line TG is coupled to the gates of the transistors in the switch set SW via the hookup region 20 from an upper part of the memory cell array 10. The contact V1, for example, is provided between the conductor 76 (one interconnect 24) provided in the interconnect layer M2 and the corresponding conductor 69 (one interconnect 25) provided in the interconnect layer M1, i.e., in the region where the interconnects 24 and 25 intersect, and the interconnects 24 and 25 are electrically coupled.

The structure of the semiconductor memory 1 according to the first embodiment is not limited to the above-described structure. For example, the number of word lines WL and the number of select gate line SGD or SGS may be changed based on the number of memory cell transistors MT and the number of select transistor ST1 or ST2, respectively. A plurality of conductors 35 provided in a plurality of layers may be assigned to the select gate line SGS, and a plurality of conductors 44 provided in a plurality of layers may be assigned to the select gate line SGD.

While each NAND string NS is formed with one memory pillar MH in the above-described structure, each NAND string NS may be formed with a plurality of memory pillars MH that are connected in the Z direction. The contacts that electrically couple the conductors provided in different interconnect layers may be formed as a plurality of contacts that are connected in the Z direction. Further, the plurality of contacts may be connected via conductors that are provided in the respective interconnect layers.

The whole block decoder BD may be included under the memory cell array 10, or the end region of the block decoder BD may be included in the hookup region 21. Of the transistors included in the row decoder module 15, the height in which the transistors included in the switch set SW are formed may be different from the height in which the transistors included in the block decoder BD are formed. The number of interconnect layers provided in the lower part LL and the number of interconnect layers provided in the upper part UL may be designed in a discretionary manner.

[1-2] Advantage of First Embodiment

According to the semiconductor memory 1 of the first embodiment described above, it is possible to reduce the chip area of the semiconductor memory 1. This advantage will be described in detail below.

The semiconductor memory device may be configured such that a peripheral circuit such as a sense amplifier module is arranged under a memory cell array. In such semiconductor memory device, for example, word lines coupled to the memory cell array are coupled to the row decoder module provided under the memory cell array via interconnects in a longitudinal direction.

Figure 16:
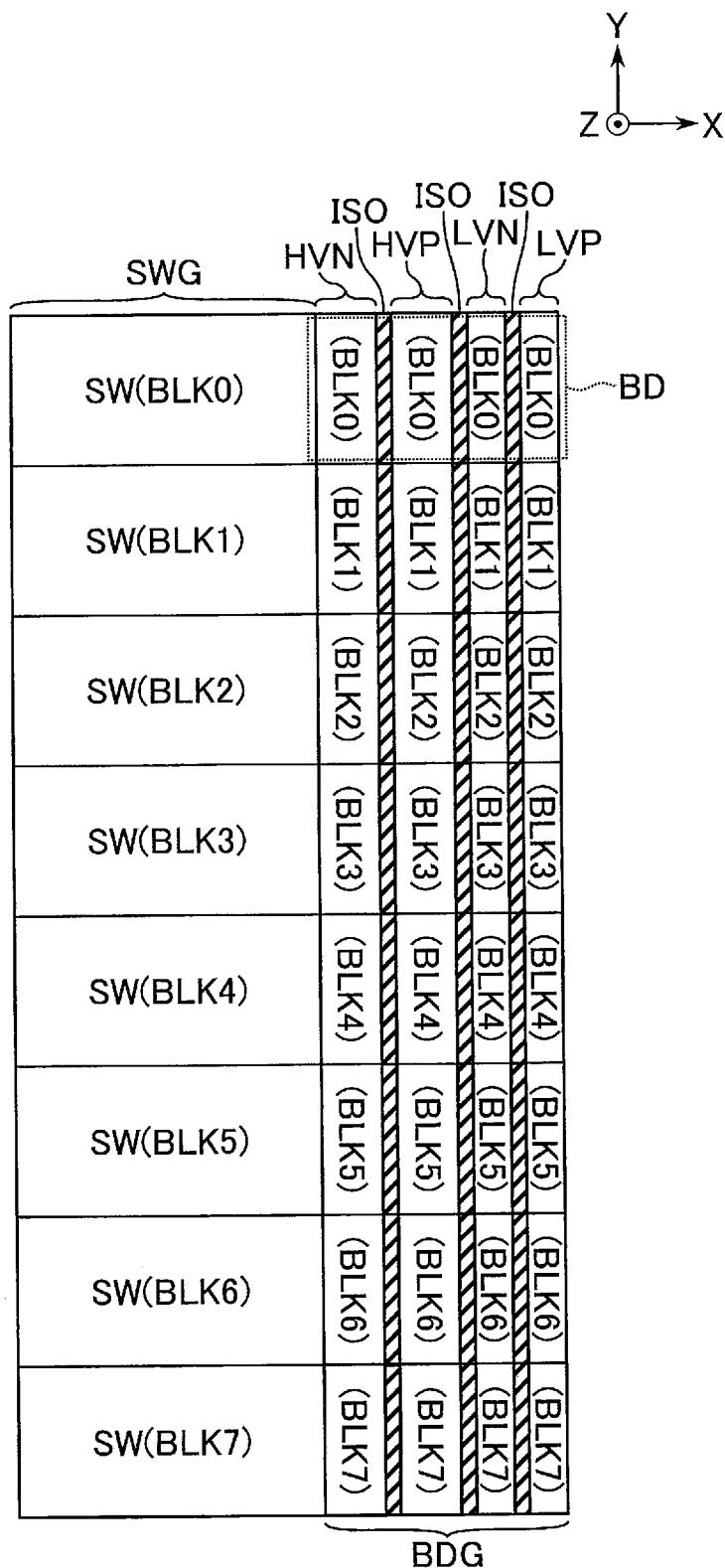
FIG. 16 is a plan view illustrating an example of a planer layout of a block decoder group in a comparative example of the first embodiment.

FIG. 16 illustrates an example of a planer layout of a row decoder module in a comparative example of the first embodiment, by extracting eight blocks BLK0 to BLK7. As illustrated in FIG. 16, in the row decoder module of the comparative example, the switch set group SWG and the block decoder group BDG are adjacent in the X direction.

Specifically, in the switch set group SWG region, switch sets SW corresponding to respective blocks BLK0 to BLK7 are aligned in the Y direction. In the block decoder group BDG region, the regions HVN, HVP, LVN, and LVP of the block decoder BD of each of blocks BLK0 to BLK 7 are aligned in the Y direction, and the element isolation region ISO is provided between the adjacent regions. The switch set SW corresponding to the block BLK0, and the regions HVN, HVP, LVN, and LVP of the block decoder BD corresponding to block BLK0 are aligned in the X direction. The same applies to the relationship between the switch set SW and the block decoder BD of another block BLK.

In contrast, in the semiconductor memory 1 according to the first embodiment, the word line switch (transistors TR in the switch set SW) and the block decoder BD included in the row decoder module 15 are arranged away from each other. In other words, a set of corresponding switch set SW and block decoder BD is not arranged on the straight line along the X direction.

The interconnects that couple the block decoder group BDG and the switch set group SWG pass over the memory cell array 10. For example, the switch set group SWG is provided to be adjacent to the memory cell array 10, and the block decoder group BDG is provided on the peripheral circuit region 22. The block decoder group BDG and the gates of the transistors included in the switch set SW of each block BLK are coupled via the interconnect 23 provided in the lower part LL of the semiconductor memory 1 and the interconnects 24 and 25 provided in the upper part UL of the semiconductor memory 1.

In the semiconductor memory 1 according to the first embodiment, at the circuit constituting the row decoder module 15, the switch set SW is provided to be adjacent to memory cell array 10 in the plan view, and the block decoder BD is provided under the memory cell array 10. That is, of the circuit constituting the row decoder module 15, the area where the block decoder BD is provided is included in the region where the memory cell array 10 of the semiconductor memory 1 is formed.

Thus, in the semiconductor memory 1 according to the first embodiment, it is possible to decrease the dimension of the hookup region 20 in the X direction as compared to when sets of the switch set SW and the block decoder BD are adjacent as in the comparative example. If there is a vacancy under the memory cell array 10, the block decoder BD may be arranged under the memory cell array 10. Thus, the semiconductor memory 1 according to the first embodiment can improve the layout efficiency of each structural element, and can reduce the chip area of the semiconductor memory 1.

In the semiconductor memory 1 according to the first embodiment, as illustrated in FIG. 9, for example, the circuit region corresponding to the block BLK0 and the circuit region corresponding to the block BLK4 are adjacent to thereby from a plurality of circuit regions together in, for example, a rectangular region.

For example, in the comparative example, the circuits corresponding to one block BLK are repeatedly arranged in the Y direction. On the other hand, in the first embodiment, the circuits corresponding to four blocks BLK aligned in the X direction are repeatedly arranged in the Y direction. That is, in the semiconductor memory 1 according to the first embodiment, the arrangement of the switch set SW in the switch set group SWG region is different from the arrangement of the block decoder BD in the block decoder group BDG region in the repeat pattern of the circuits corresponding to each block BLK.

Thus, in the semiconductor memory 1 according to the first embodiment, it is possible to freely design the arrangement of the circuit region corresponding to each block BLK in the block decoder BD. That is, in the semiconductor memory 1 according to the first embodiment, it is possible to form the circuits corresponding to the plurality of blocks BLK together in the block decoder group BDG region.

In this manner, in the semiconductor memory 1 according to the first embodiment, the interconnect length can be short and the interconnect width can be increased in the block decoder BD. As a result, it is possible to reduce the interconnect resistance in the block decoder BD, and to suppress the power consumption of the semiconductor memory 1. In the present specification, the phrase "increasing the interconnect width" includes a case where a plurality of interconnects are coupled in parallel.

In the semiconductor memory 1 according to the first embodiment, it is possible to reduce the area of the element isolation region ISO provided between the adjacent regions of the regions HVN, HVP, LVN and LVP. Therefore, in the semiconductor memory 1 according to the first embodiment, the circuit area of the block decoder group BDG can be reduced, and the chip area of the semiconductor memory 1 can be suppressed.

Moreover, in the semiconductor memory 1 according to the first embodiment, the interconnect length of the power line supplied to the block decoder BD can be short and the interconnect width can be increased. As a result, in the semiconductor memory 1 according to the first embodiment, it is possible to improve the operation margin of the block decoder BD, and to reduce the power of the power supply supplying the voltage to the block decoder BD, and thus it is possible to reduce the area of the power supply.

[2] Second Embodiment

In the semiconductor memory 1 according to the second embodiment, the path coupled to the switch set SW in the block decoder BD is different from that of the semiconductor memory 1 according to the first embodiment. Hereinafter, the semiconductor memory 1 according to the second embodiment will be described regarding the points different from that of the first embodiment.

[2-1] Structure of Semiconductor Memory 1

Figure 17:
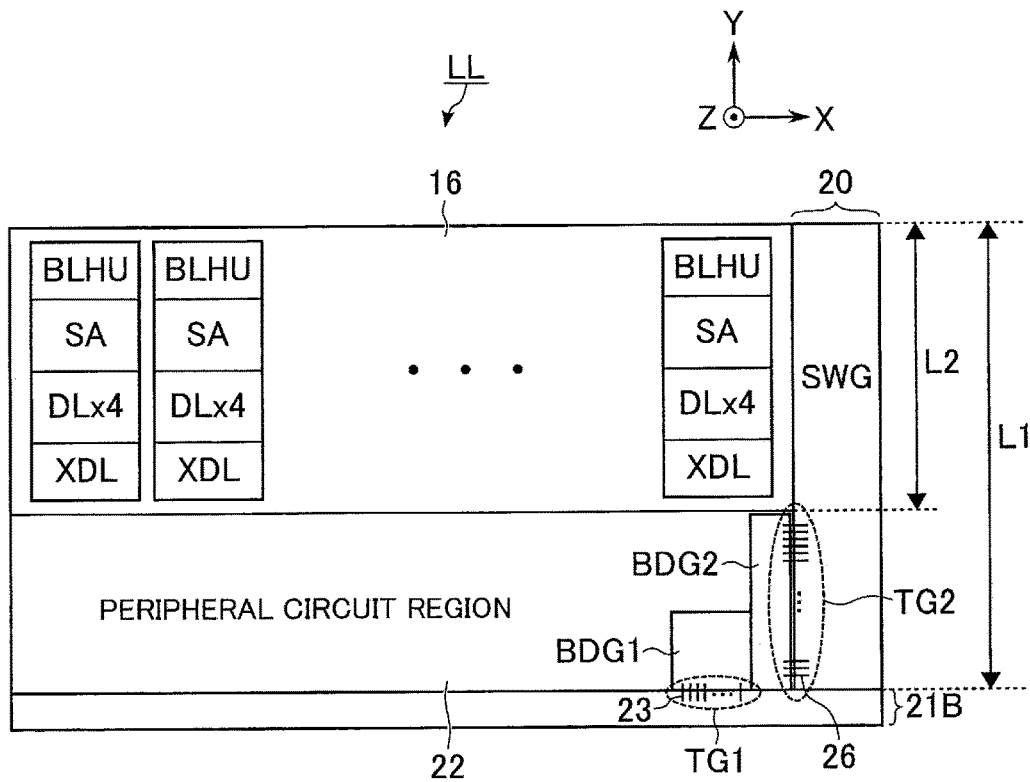
FIG. 17 is a plan view illustrating an example of a planer layout in a lower part of a semiconductor memory according to a second embodiment.

FIG. 17 illustrates an example of a more detailed planer layout of the lower part LL in the semiconductor memory 1 according to the second embodiment.

As illustrated in FIG. 17, the peripheral circuit region 22 includes block decoder groups BDG1 and BDG2, and a plurality of interconnects 23 and 26.

Each of the block decoder groups BDG1 and BDG2 includes, for example, a plurality of block decoders BD. The block decoder group BDG1 region is, for example, adjacent to the hookup region 21B in the Y direction. The block decoder group BDG2 region is, for example, adjacent to the hookup region 20 in the X direction.

The plurality of interconnects 23 are coupled to the block decoder group BDG1. Specifically, the plurality of interconnects 23 are coupled to respective block decoders BD included in the block decoder group BDG1, and one end of each of the plurality of interconnects 23 is drawn out to the hookup region 21B.

Each of the interconnects 23 functions as a transfer gate line TG1. The transfer gate line TG1 is, like the transfer gate line TG described in the first embodiment, coupled to the corresponding switch set SW via the interconnects (e.g., interconnects 24 and 25) passing over the memory cell array 10. The switch set SW to which the transfer gate line TG1 is coupled is, for example, adjacent to the arrangement of the sense amplifier module 16 in the X direction.

The plurality of interconnects 26 are coupled to the block decoder group BDG2. Specifically, the plurality of interconnects 26 are coupled to respective block decoders BD included in block decoder group BDG2, and one end of each of the plurality of interconnects 23 is drawn out to the hookup region 20.

Each of the interconnects 26 functions as a transfer gate line TG2. The transfer gate line TG2 is coupled to the corresponding switch set SW without interconnects passing over the memory cell array 10. That is, the transfer gate line TG2 in the second embodiment is electrically coupled to the corresponding switch set SW via the conductor and the contact provided in the lower part LL of the semiconductor memory 1. The switch set SW to which the transfer gate line TG2 is coupled is, for example, adjacent to the peripheral circuit region 22 in the X direction.

The remaining structure of the semiconductor memory 1 according to the second embodiment is similar to that of the semiconductor memory 1 according to the first embodiment, and descriptions thereof will be omitted.

[2-2] Advantage of Second Embodiment

The semiconductor memory 1 according to the second embodiment described above can achieve the advantage similar to that of the second embodiment according to the first embodiment.

In addition, the semiconductor memory 1 according to the second embodiment includes the transfer gate line TG1 coupled to the switch set SW passing over the memory cell array 10, and the transfer gate line TG2 coupled to the switch set SW without passing over the memory cell array 10.

That is, in the semiconductor memory 1 according to the second embodiment, for example, the number of interconnects 25 provided in the interconnect layer M1 and the number of interconnects 24 provided in the interconnect layer M2 is less in comparison to the first embodiment. As a result, in the semiconductor memory 1 according to the second embodiment, there is a margin in an interconnect layout of the interconnect layers M1 and M2 in comparison to the semiconductor memory 1 according to the first embodiment.

Thus, in the semiconductor memory 1 according to the second embodiment, the density of the circuit pattern of the interconnect layers M1 and M2 can be lowered. Moreover, because of reduction in the density of the circuit pattern, other interconnects can be formed to be thick. As a result, in the semiconductor memory 1 according to the second embodiment, it is possible to suppress the difficulty level of processing in the manufacture of the semiconductor memory 1, and to improve the yield ratio more than the first embodiment.

[3] Third Embodiment

The semiconductor memory 1 according to the third embodiment is different from that of the first embodiment in an arrangement of the block decoder group BDG. Hereinafter, the semiconductor memory 1 according to the third embodiment will be described regarding the points different from the semiconductor memory 1 of the first and second embodiments.

[3-1] Structure of Semiconductor Memory 1

Figure 18:
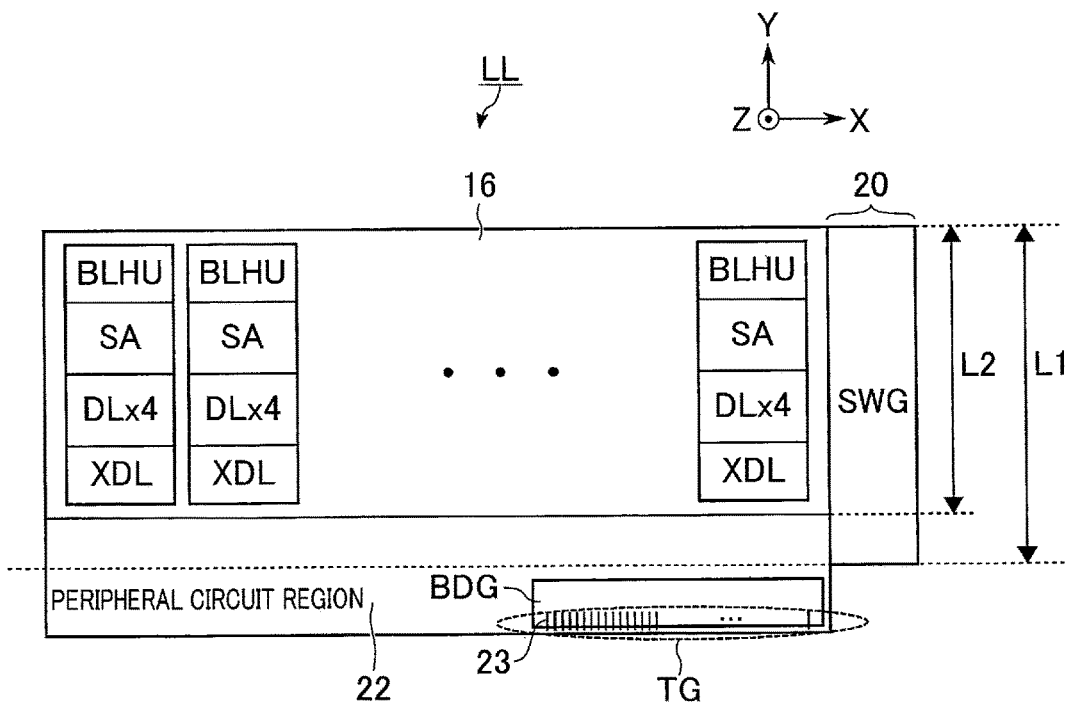
FIG. 18 is a plan view illustrating an example of a planer layout in a lower part of a semiconductor memory according to a third embodiment.

FIG. 18 illustrates an example of a more detailed planer layout of the lower part LL in the semiconductor memory 1 according to the third embodiment.

As illustrated in FIG. 18, in the third embodiment, the ratio of the width L2 of the sense amplifier module 16 region in the Y direction to the width L1 of the switch set group SWG region in the Y direction is higher than that of the first embodiment.

Therefore, the peripheral circuit region 22 in the third embodiment includes a portion not adjacent to the switch set group SWG in the X direction. That is, in the third embodiment, the peripheral circuit region 22 includes a portion that does not overlap the memory cell array 10.

The block decoder group BDG included in the peripheral circuit region 22 is provided in, for example, a region not overlapping the memory cell array 10. Like the first embodiment, the plurality of interconnects 23 coupled to the block decoder group BDG, for example, pass over the memory cell array 10, and are electrically coupled to the corresponding switch set SW.

The block decoder group BDG region in the peripheral circuit region 22 is not limited to the arrangement illustrated in FIG. 18. For example, the block decoder group BDG region may include a portion overlapping the memory cell array 10.

The remaining structure of the semiconductor memory 1 according to the third embodiment is similar to that of the semiconductor memory 1 according to the first embodiment, and descriptions thereof will be omitted.

[3-2] Advantage of Third Embodiment

In the semiconductor memory device, if the area of the memory cell array 10 becomes smaller because of micronization, the sense amplifier module 16 region and the peripheral circuit region 22 may not be placed under the memory cell array 10.

In the semiconductor memory 1 according to the third embodiment, the block decoder group BDG is provided in the region not included under the memory cell array 10 of the peripheral circuit region 22. Even in such a case, the semiconductor memory 1 according to the third embodiment can achieve the same advantage as the semiconductor memory 1 according to the first embodiment.

4. Modifications, Etc.

In this manner, the chip area of the semiconductor memory 1 can be decreased.

The above-described embodiments have exemplified the case where the hookup region 20 is provided in one side in the X direction with respect to the memory cell array 10, but the invention is not limited to this. For example, the hookup regions 20 may be provided in both one side and the other side in the X direction with respect to one memory cell array 10.

FIG. 19 illustrates an example of a planer layout in the upper part UL and the lower part LL of the semiconductor memory 1 according to the modification of the first embodiment.

As illustrated in FIG. 19, in the semiconductor memory 1 according to the modification of the first embodiment, at the upper part UL, the hookup region 20A is adjacent to the one side in the X direction of the memory cell array 10 region, and the hookup region 20B is adjacent to the other side.

At the lower part LL, the arrangement of the block decoder group BDG is similar to that of the first embodiment, and the plurality of interconnects 23 are drawn out to the hookup region 21B. A switch set group SWG1 is adjacent to the one side in the X direction of each of the sense amplifier module 16 region and the peripheral circuit region 22, and a switch set group SWG2 is adjacent to the other side. The switch set groups SWG1 and SWG2 overlap the hookup regions 20A and 20B, respectively.

The select gate lines SGS and SOD and the word lines WL0 to WL7 corresponding to each block BLK are categorized into two groups, and a first group is assigned to the switch set group SWG1 while a second group is assigned to the switch set group SWG2.

The interconnect of the memory cell array 10 corresponding to the first group is drawn out from the one side in the X direction, and is coupled to the switch set group SWG1 via the hookup region 20A. The interconnect of the memory cell array 10 corresponding to the second group is drawn out from the other side in the X direction, and is coupled to the switch set group SWG2 via the hookup region 20B.

Figure 20:
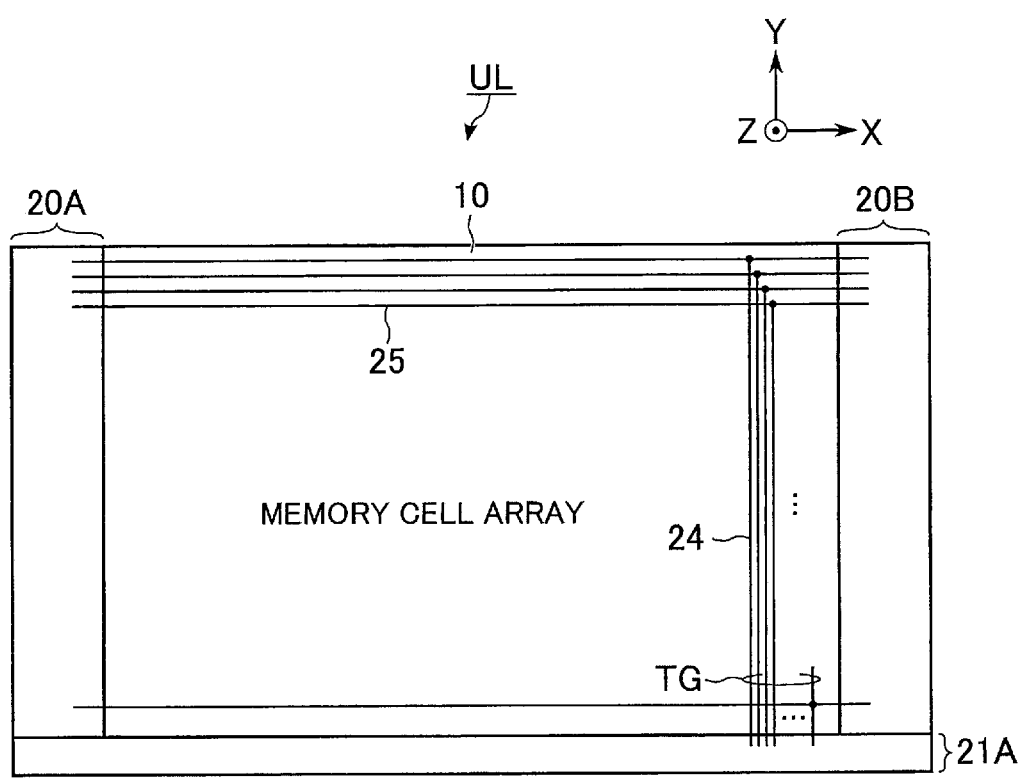
FIG. 20 is a plan view illustrating an example of a planer layout in the upper part of the semiconductor memory according to the modification of the first embodiment.

FIG. 20 illustrates an example of a detailed planer layout in the upper part UL of the semiconductor memory 1 according to the modification of the first embodiment.

As illustrated in FIG. 20, in the modification of the first embodiment, like the first embodiment, at the upper part UL, a plurality of interconnects 24 extending in the Y direction are provided. In the modification of the first embodiment, a plurality of interconnects 25 extending in the X direction are provided from the hookup region 20A to the hookup region 20B. In the modification of the first embodiment, each interconnect 25 is coupled to the corresponding switch set SW in the switch set group SWG1 via the hookup region 20A, and is coupled to the corresponding switch set SW in the switch set group SWG2 via the hookup region 20B.

Thus, in the semiconductor memory 1 according to the modification of the first embodiment, voltages can be applied to various interconnects coupled to the NAND string NS from either one side or the other side of the memory cell array 10.

In the semiconductor memory 1 according to the modification of the first embodiment, the switch set SW may not be necessarily categorized into the first and second groups. Instead, various interconnects that are coupled to the NAND string NS may be driven from both sides of the memory cell array 10. Moreover, the semiconductor memory 1 according to the modification of the first embodiment may include not only a double-end-driven structure in which interconnects coupled to the NAND string NS are driven from both sides but also a single-end-driven structure in which interconnects coupled to the NAND string NS are driven from one side.

The above-described embodiments have exemplified the case where the interconnects 23 coupled to the block decoder group BDG are drawn out from the side of the memory cell array 10, but the present invention is not limited to this. For example, the interconnects 23 may be electrically coupled to the interconnects 25 via the contacts passing through the stacked interconnects including the word lines WL and the select gate lines SGD and SGS in the memory region MR and the hookup region HR.

In other words, the conductor 73 in the interconnect layer D2 and the conductor 74 in the interconnect layer M0 may be electrically coupled via, for example, the contact passing through the conductors 34 to 44. The number or types of the conductors through which the contact passes may be different depending on the region where the contact is formed.

In the above description, the case where one memory cell array 10 is provided has been exemplified, but the number of memory cell arrays 10 included in the semiconductor memory 1 may be set in a discretionary manner. For example, at the upper part UL of the semiconductor memory 1, two or more memory cell arrays 10 may be provided. In this case, the hookup region 20 may be provided to be in contact with a plurality of memory cell arrays 10, or the plurality of hookup regions 20 may be in contact with the respective memory cell arrays 10. The layout of the semiconductor memory 1 can be appropriately changed based on the design of the memory cell array 10.

In the above-described embodiments, the case where the memory pillar MP has a taper shape in which the diameter decreases toward the semiconductor substrate 30 side has been exemplified, but the present invention is not limited to this. For example, the cross-sectional shape of the memory pillar MP may be a barrel shape having a fat middle part, or may be a reverse-taper shape in which the diameter increases toward the substrate side.

The memory cell array 10 may have other structures. For example, the memory cells may be formed two dimensionally. If the memory cells are formed three dimensionally, the memory pillar may be U-shaped.

A layer (first layer) in which the memory cell array 10 is provided and a layer (second layer) in which the level shifter is formed may be formed into different chips, respectively. In this case, one chip including the memory cell array 10 and another chip including the level shifter may bonded, and a pair of the bonded chips is used as the semiconductor memory 1 in the above-described embodiments.

In the semiconductor memory in which the chip including the memory cell array 10 and the chip including the level shifter are bonded, the "semiconductor substrate" in the present specification corresponds to the semiconductor substrate of the chips including the peripheral circuit. If the side in which the semiconductor substrate of the chip including the memory cell array 10 is present is defined as a lower side while the side in which the memory cell array 10 is provided is defined as an upper side, the "layer (third layer) above the first layer" in the present specification corresponds to a further upper layer of the memory cell array 10.

The remaining configuration of the memory cell array 10 is described in, for example, U.S. patent application Ser. No. 12/407,403, entitled "Three-dimensional Stacked Nonvolatile Semiconductor Memory", filed on Mar. 19, 2009. It is also described in U.S. patent application Ser. No. 12/406,524, entitled "Three-dimensional Stacked Nonvolatile Semiconductor Memory", filed on Mar. 18, 2009, and U.S. patent application Ser. No. 12/679,991, entitled "Nonvolatile Semiconductor Memory Device and Manufacturing Method Thereof", filed Mar. 25, 2010, and U.S. patent application Ser. No. 12/532,030, entitled "Semiconductor Memory and Manufacturing Method Thereof", filed on Mar. 23, 2009. The entire contents of those patent applications are incorporated herein by reference.

The term "coupling" in the present specification indicates electrical coupling, and does not exclude interposing separate elements therebetween. The term "interconnect" may include a contact electrically coupling two conductors. For example, the interconnect corresponding to the transfer gate line TG in the first embodiment corresponds to an assembly of the interconnect and the contact electrically coupling the conductors 61 and 70. The term "adjacent" does not necessarily mean being in contact, and an element isolation region, etc., may be included therebetween. The phrase "length of the bit line BL" corresponds to the length of the conductor 45 extending in the Y direction, for example. The set of logic circuit LC and AND circuit AD may also be referred to as, for example, an address decoder. The circuit configuration of the address decoder may be appropriately changed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a memory cell array in a first layer above a semiconductor substrate, the memory cell array including a plurality of memory cells;
a first word line coupled to a first memory cell included in the plurality of memory cells;
a driver generating a voltage applied to the first word line;
a first transistor including one end coupled to the first word line and the other end coupled to the driver;
a first transfer gate line coupled to a gate of the first transistor, the first transfer gate line including a portion passing through the first layer, a second layer between the semiconductor substrate and the first layer, and a third layer above the first layer;
a first level shifter applying a voltage to the first transfer gate line;
a second word line coupled to a second memory cell included in the memory cells;
a second transistor including one end coupled to the second word line and the other end coupled to the driver;
a second transfer gate line coupled to a gate of the second transistor;
a second level shifter applying a voltage to the second transfer gate line,
wherein a direction in which a region where a circuit corresponding to the first level shifter is provided and a region where a circuit corresponding to the second level shifter is provided are aligned is different from a direction in which the first transistor and the second transistor are aligned, and
the second transistor is arranged along a third side of a rectangular region where the memory cell array is provided, and the second level shifter is arranged along the third side of the rectangular region.

2. The memory of claim 1, wherein
the first transfer gate line includes a portion extending in a first direction intersecting with an extending direction of the first word line.

3. The memory of claim 1, further comprising:
a plurality of bit lines coupled to the memory cell array, each of the bit lines extending in a first direction; and
a sense amplifier module under the memory cell array, the sense amplifier module including a plurality of sense amplifiers respectively coupled to the bit lines,
wherein a dimension in the first direction of a rectangular region where the sense amplifier module is provided is equal to or larger than a half of a dimension in the first direction of a rectangular region where the memory cell array is provided.

4. The memory of claim 3, wherein
a distance between the first transistor and the first level shifter is equal to or larger than a half of a length of the bit lines.

5. The memory of claim 3, wherein
the sense amplifier module and the first transistor are adjacent.

6. The memory of claim 3, wherein
the sense amplifier module includes a plurality of latch circuits.

7. The memory of claim 1, wherein
the first transistor and the first level shifter are not arranged on a straight line along the extending direction of the first word line.
8. The memory of claim 1, wherein
the first transistor is arranged along a first side of a rectangular region where the memory cell array is provided, and
the first level shifter is arranged along a second side different from the first side of the rectangular region.
9. The memory of claim 8, wherein
the first transfer gate line intersects with the first side and the second side of the memory cell array.
10. The memory of claim 1, wherein
the second transfer gate line includes no portion passing through the first layer.
11. The memory of claim 1, wherein
the second transistor and the second level shifter are arranged on a straight line along an extending direction of the second word line.
12. The memory of claim 1, wherein
the second transfer gate line intersects with the third side of the memory cell array, and does not intersect with a fourth side different from the third side of the rectangular region.
13. The memory of claim 1, wherein
the first level shifter is provided on the semiconductor substrate, and
a region where the first level shifter is provided includes a portion arranged under the memory cell array.
14. The memory of claim 1, wherein
the first level shifter is provided on the semiconductor substrate, and
a region where the first level shifter is provided includes no portion arranged under the memory cell array.
15. The memory of claim 1, further comprising:
an address decoder coupled to the first level shifter,
wherein the memory cell array includes a plurality of blocks, and the address decoder controls the first level shifter in accordance with an inputted block address.
16. The memory of claim 1, further comprising:
a plurality of conductive layers stacked via insulating layers; and
a pillar passing through the conductive layers,
wherein one conductive layer included in the conductive layers is used as the first word line, and
portions where the conductive layers and the pillar intersect function as memory cell transistors.

\* \* \* \* \*